United States Patent
Dreps et al.

(10) Patent No.: US 10,181,628 B2
(45) Date of Patent: Jan. 15, 2019

(54) REDUCTION OF CROSSTALK BETWEEN DIELECTRIC WAVEGUIDES USING SPLIT RING RESONATORS

(71) Applicant: International Business Machines Corporation, Armonk, NY (US)

(72) Inventors: Daniel M. Dreps, Georgetown, TX (US); Jose A. Hejase, Austin, TX (US); Joshua C. Myers, Austin, TX (US); Junyan Tang, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 34 days.

(21) Appl. No.: 15/331,658

(22) Filed: Oct. 21, 2016

(65) Prior Publication Data

US 2018/0115043 A1    Apr. 26, 2018

(51) Int. Cl.
| | |
|---|---|
| H01P 3/16 | (2006.01) |
| H01P 11/00 | (2006.01) |
| H01P 3/12 | (2006.01) |
| H01Q 21/00 | (2006.01) |
| H05K 1/02 | (2006.01) |

(52) U.S. Cl.
CPC .............. *H01P 3/16* (2013.01); *H01P 3/121* (2013.01); *H01P 11/006* (2013.01); *H01Q 21/0068* (2013.01); *H05K 1/024* (2013.01); *H05K 1/0216* (2013.01); *H05K 1/0298* (2013.01)

(58) Field of Classification Search
CPC .......... H01P 3/16; H01P 3/121; H01P 11/001; H01P 11/002; H01P 11/006; H01P 5/103
USPC .............................................. 333/1, 239, 26
See application file for complete search history.

(56) References Cited

U.S. PATENT DOCUMENTS

| | | | |
|---|---|---|---|
| 2002/0027481 A1* | 3/2002 | Fiedziuszko | H01P 1/203 333/116 |
| 2013/0127559 A1* | 5/2013 | Lin et al. | H04B 3/32 333/1 |
| 2014/0285291 A1* | 9/2014 | Payne et al. | H01P 3/16 333/239 |

OTHER PUBLICATIONS

G. Eason, B. Noble, and I. N. Sneddon, "On certain integrals of Lipschitz-Hankel type involving products of Bessel functions," Phil.Trans. Roy. Soc. London, vol. A247, pp. 529-551, Apr. 1955.
Yeh, Cavour, Fred Shimabukuro, and Peter H. Siegel. "Low-loss terahertz ribbon waveguides." Applied optics 44.28 (2005): 5937-5946.
Chahal, Premjeet, et al. "Planar surface plasmonic structures for terahertz circuits and sensors." Electronic Components and Technology Conference (ECTC), 2012 IEEE 62nd. IEEE, 2012.
Wang, Kanglin, and Daniel M. Mittleman. "Metal wires for terahertz waveguiding." Nature 432.7015 (2004): 376-379.
(Continued)

*Primary Examiner* — Benny Lee
(74) *Attorney, Agent, or Firm* — Patterson + Sheridan, LLP

(57) ABSTRACT

Embodiments herein describe a high-speed communication channel in a PCB that includes a dielectric waveguide sandwiched between two ground layers. The dielectric waveguide includes a core and a cladding where the material of the core has a higher dielectric constant than the material of the cladding. Thus, electromagnetic signals propagating in the core are internally reflected at the interface between the core and cladding such that the electromagnetic signals are primary contained in the core.

17 Claims, 16 Drawing Sheets

(56) References Cited

OTHER PUBLICATIONS

Miyagi, Mitsunobu, and Shojiro Kawakami. "Design theory of dielectriccoated circular metallic waveguides for infrared transmission." LightwaveTechnology, Journal of 2.2 (1984): 116-126.
Bingham, Adam, Yuguang Zhao, and D. Grischkowsky. "THz parallelplate photonic waveguides." Applied Physics Letters 87.5 (2005): 051101-051101.
Wu, Ziran, et al. "Hollow-core electromagnetic band gap (EBG) waveguide fabricated by rapid prototyping for low-loss Terahertz guiding." Microwave Symposium Digest (MTT), 2010 IEEE MTT-S International. IEEE, 2010.
Gallot, G., et al. "Terahertz waveguides." JOSA B 17.5 (2000): 851-861.
Yang, Xianbo, and Premjeet Prem Chahal. "On-Wafer Terahertz Ribbon Waveguides Using PolymerCeramic Nanocomposites." Components, Packaging and Manufacturing Technology, IEEE Transactions on 5.2 (2015): 245-255.
Landy, N. I., et al. "Perfect metamaterial absorber." Physical review letters 100.207402 , May 2008.

* cited by examiner

REDUCTION OF CROSSTALK BETWEEN DIELECTRIC WAVEGUIDES USING SPLIT RING RESONATORS

BACKGROUND

The present invention relates to a dielectric waveguide in a multi-layer printed circuit board (PCB).

Computing systems rely on high speed buses to transmit data between different components—e.g., processors, memory, accelerators, I/O devices, graphics cards, and the like. Differential signaling is primarily used for short high speed buses. In this technique, each signal line includes two wires which transmit opposite polarity signals. A receiver coupled to the two wires calculates the voltage difference between the wires to determine the data bit being transmitted. Using differential signaling rather than a single wire for each data bit significantly reduces the impact of noise and radiated emissions on the transmitted signal. However, as data speeds increase (e.g., greater than 25 Gb/s), the lengths at which a bus can effectively use differential signaling are reduced.

Fiber optics is another technique for transmitting data between computing devices at high speeds. Fiber optics can transmit signals at speeds above 100 Gb/s for much farther distances than a bus that uses differential signal. However, optical transmitters and receivers are expensive and require more space relative to the drivers and receivers used to perform differential signaling.

SUMMARY OF THE INVENTION

One embodiment of the present disclosure is a dielectric waveguide layer that includes a first dielectric core forming a first dielectric waveguide, a second dielectric core forming a second dielectric waveguide, and a cladding disposed between the first and second dielectric cores where a material of the first core has a higher dielectric constant than a material of the cladding. The dielectric waveguide layer also includes a periodic resonator disposed in the cladding between the first and second dielectric cores, the periodic resonator including a plurality of resonating structures arranged in an array and where each of the plurality of resonating structures is configured to resonate at a common resonant frequency.

Another embodiment of the present disclosure is a multi-layer printed circuit board (PCB) that includes a first dielectric core forming a first dielectric waveguide, a second dielectric core forming a second dielectric waveguide, and a cladding disposed between the first and second dielectric cores where a material of the first core has a higher dielectric constant than a material of the cladding. The PCB also includes a periodic resonator disposed in the cladding between the first and second dielectric cores, the periodic resonator including a plurality of resonating structures arranged in an array and where each of the plurality of resonating structures is configured to resonate at a common resonant frequency.

Another embodiment of the present disclosure is a method that includes transmitting a non-optical electromagnetic signal into a first end of first dielectric core forming a first dielectric waveguide in a dielectric waveguide layer where the dielectric waveguide layer includes a second dielectric core forming a second dielectric waveguide, where a cladding is disposed between the first and second dielectric cores, and where a material of the first core has a higher dielectric constant than a material of the cladding. The method includes receiving the non-optical electromagnetic signal at a second end of the first dielectric core where a periodic resonator is disposed in the cladding between the first and second dielectric cores. The periodic resonator includes a plurality of resonating structures arranged in an array where each of the plurality of resonating structures is configured to resonate at a frequency of the non-optical electromagnetic signal to mitigate cross talk between the first dielectric core and the second dielectric core.

BRIEF DESCRIPTION OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION OF THE INVENTION

Embodiments herein describe a high-speed communication channel in a PCB that includes a dielectric waveguide. The dielectric waveguide includes a core and a cladding where the material of the core has a higher dielectric constant than the material of the cladding. Thus, electromagnetic signals propagating in the core are internally reflected at the interface between the core and cladding such that the electromagnetic signals are primarily contained in the core. In one embodiment, the dielectric waveguide is coupled at respective ends to coaxial vias that each include a center conductor and an outer conductor (or shield) which extend through one or more layers of the PCB. One of the coaxial vias radiates electromagnetic signals into the dielectric waveguide at a first end of the core while the other coaxial via receives the radiated signals at a second end of the core. For example, the center conductor extends into the core of the dielectric material and functions like an antenna to radiate the electromagnetic signal into the core. After traveling through the dielectric waveguide, the electromagnetic signal reaches the center conductor of another coaxial via which receives the signal. In one embodiment, the center conductors of the coaxial vias are bonded to respective integrated circuits (e.g., processors or application specific integrated circuits (ASICs)) mounted on the PCB. The integrated circuits can use the coaxial vias and dielectric waveguide to transmit high speed data signals (e.g., greater than 70 Gb/s) between each other.

Figure 1:
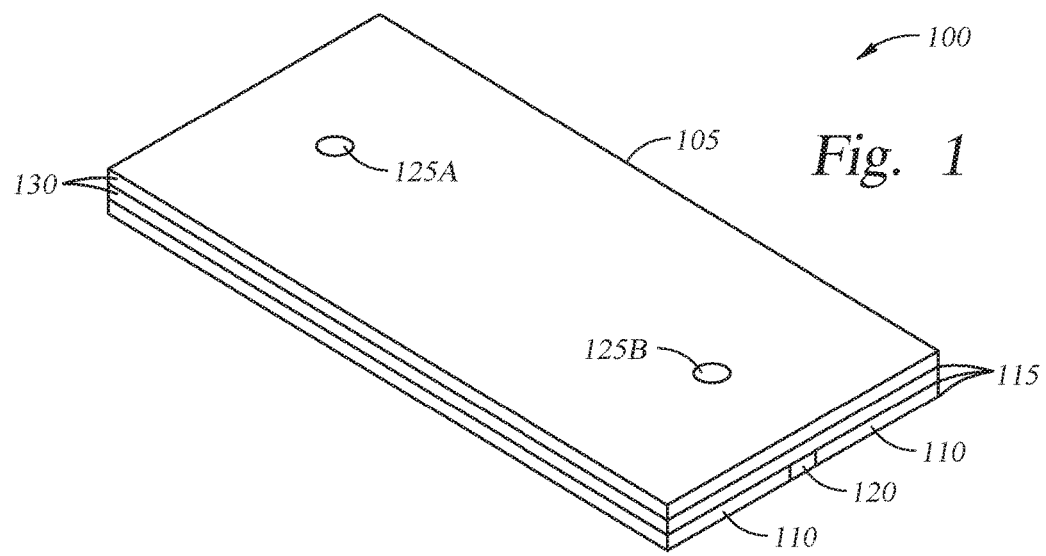
FIG. 1 illustrates a multi-layer PCB with a dielectric waveguide, according to one embodiment described herein.

FIG. 1 illustrates a communication system 100 that includes a multi-layer PCB 105 with a dielectric waveguide, according to one embodiment described herein. As shown, the PCB 105 includes multiple dielectric layers 130 that are separated by ground layers 115. The dielectric layers 130 can be any rigid insulative material that can provide support for the components mounted to the PCB 105. However, the various layers shown in FIG. 1 can form either a rigid PCB that is not intended to bend or curve, or a flexible PCB (i.e., a flex PCB) in which case the dielectric layers 130 and ground layers 115 are able to bend without breaking. The ground layers 115 can be conductive layers—e.g., copper sheets.

In one embodiment, the material of the core 120 and the cladding 110 is a polymer or a composite material. For example, the core 120 and the cladding 110 may be formed by photoresists which have the requisite dielectric constants for guiding an electromagnetic wave. The photoresists can be applied onto the multi-layer PCB 105 to form the dielectric waveguide using different fabrication steps. In one embodiment, the core 120 has a dielectric permittivity of 4.5 at 40 GHz and loss tangent of 0.0086 also at 40 GHz. In one embodiment, the cladding 110 can be air or any other low dielectric constant material (in case of air the dielectric permittivity is 1 at all frequencies and loss tangent is 0; in case of, for example, Teflon (e.g., Polytetrafluoroethylene (PTFE)) the dielectric permittivity is 2.1 and loss tangent is 0.001 at 10 GHz). Generally, the cladding 110 has a lower permittivity than the core 120 and both should be low loss. A higher permittivity difference will provide better guiding but will also increase attenuation per unit distance due to wavelength compression. Non limiting examples include the use of polytetrafluoroethylene (PTFE) for the cladding 110 and a polyphenylene oxide-based resin as the core 120.

The bottom layer of the PCB 105 includes the core 120 and the cladding 110 sandwiched between two ground layers 115. In this embodiment, the material of the cladding 110 takes up the entire bottom layer of the PCB 105 except for the portion that includes the core 120. However, in another embodiment, the bottom layer can include a third material where the cladding 110 is disposed between the third dielectric material and the core 120. For example, the third material may be more rigid than the materials of either the core 120 or the cladding 110, and thus, is added in the bottom layer to improve the structural integrity of the PCB 105.

The communication system 100 includes respective coaxial vias 125A and 125B that couple the core 120 of the dielectric waveguide (i.e., the bottom layer of the PCB 105) to an external component such as a processor or ASIC. In one embodiment, the external components are coupled by solder (e.g., solder bumps) to pads on an outer surface of the PCB 105. The solder may be part of a ball grid array that couples multiple I/O pads on the external components to respective pads in the PCB 105. These pads are then coupled to the coaxial vias 125A and 125B to permit the PCB 105 to transmit electromagnetic signals to and/or receive electromagnetic signals from the external components.

Although FIG. 1 illustrates that the bottom layer of the PCB 105 includes only one dielectric waveguide, the dielectric waveguide may be only one of a plurality of communication channels between the external components coupled to the coaxial vias 125A and 125B. That is, the coaxial vias 125A and 125B and dielectric waveguide may be repeated in the PCB 105 to provide separate high-speed communication channels between external components. These communication channels may collectively form a high-speed bus.

In one embodiment, the electromagnetic signals transmitted using the communication system 100 have wavelengths that are greater than the wavelengths of electromagnetic signals in the visible light spectrum or infrared spectrum. That is, the wavelengths of the electromagnetic signals used in system 100 may be greater than 1000 microns. Because of the inverse relationship between wavelength and frequency, the frequencies of the electromagnetic signals used in communication system 100 may be less than the frequencies of the infrared spectrum—e.g., less than 300 GHz. By using frequencies less than infrared or visible light, expensive and bulky optical transmitters and receivers can be avoided.

Although FIG. 1 illustrates only one dielectric waveguide which facilitates high-speed communication between two external components, the multi-layer PCB 105 can be used to facilitate high speed communication between many different computing devices. For example, the PCB 105 may be part of a motherboard in a computing system that couples processors to each other as well as other periphery devices such as a graphics card, main memory, network controller, accelerators, and the like. Each of these connections may be facilitated by using one or more of the communication channels established by the dielectric waveguide and the pair of coaxial vias 125A and 125B.

Figure 2:
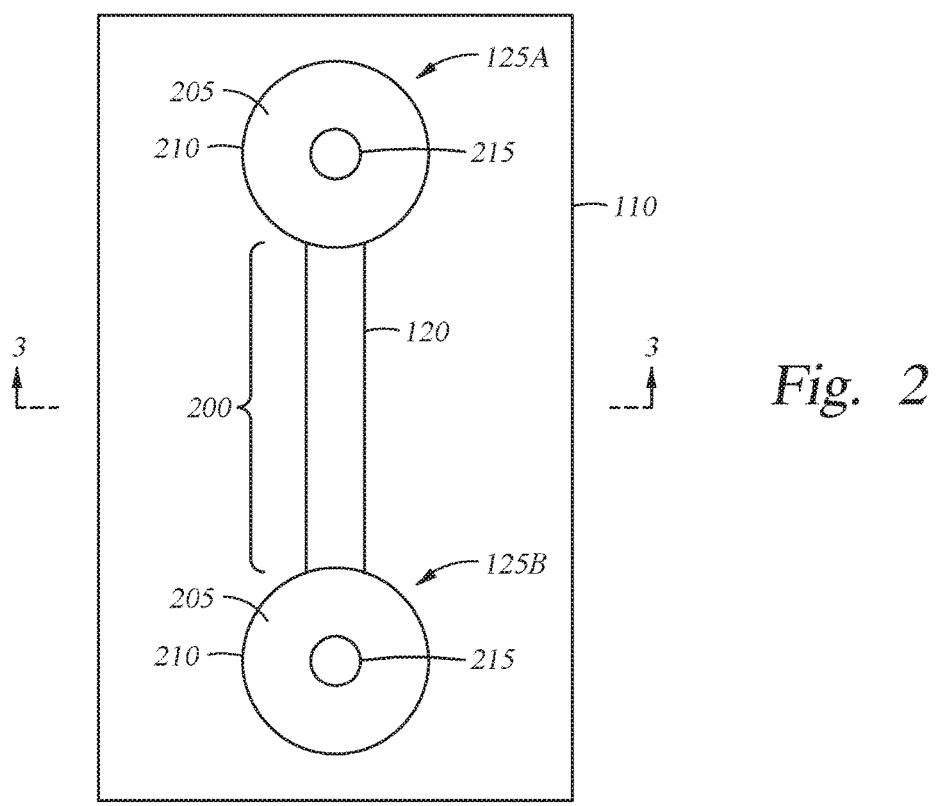
FIG. 2 illustrates a dielectric waveguide coupled to coaxial vias, according to one embodiment described herein.

FIG. 2 illustrates a dielectric waveguide 200 coupled to coaxial vias 125A and 125B, according to one embodiment described herein. FIG. 2 illustrates a top down view of the dielectric waveguide 200 where any dielectric layer or grounding layers above the waveguide 200 have been removed. As shown, the dielectric waveguide 200 includes the core 120 and cladding 110. The dielectric material of the core 120 has a higher dielectric constant than the dielectric material of the cladding 110. In one embodiment, the core 120 and cladding 110 directly contact such that there is no air gap between the two materials. Thus, electromagnetic signals propagating in the core 120 are reflected at the interface between the core 120 and cladding 110 such that the power of the electromagnetic signal is contained primarily within the core 120 (although some leakage may occur).

Any dielectric material can be used for the core 120 and the cladding 110 so long as the dielectric constants have the relationship described above. Further, if used in a rigid rather than a flexible multi-layer PCB, the dielectric material may have sufficient rigidity to provide support for the other layers in the PCB as well any components or devices mounted onto the PCB. Furthermore, the same dielectric material used for either the core 120 or the cladding 110 can also be used to form the other dielectric layers in the multi-layer PCB—e.g., dielectric layers 130 shown in FIG. 1.

The coaxial vias 125A and 125B each includes a center conductor 215 electrically insulated from an outer conductor 210 (e.g., a shield) by a dielectric 205. As described above, the center conductor 215 can be coupled to a respective pad to receive electromagnetic signals from, or transmit electromagnetic signals to, an external component. For example, an ASIC may use a solder connection to drive an electromagnetic data signal onto the center conductor 215 of coaxial via 125A. The center conductor 215 introduces the electromagnetic data signal into the dielectric waveguide 200 which guides the signal to a center conductor 215 of the coaxial via 125B. While the center conductor 215 is used to transmit the data signal, the outer conductor 210 is grounded. Moreover, the outer conductors 210 can be coupled to the ground layers 115 shown in FIG. 1.

In one embodiment, the center conductor 215 extends through the outer conductor 210 to transmit electromagnetic signals into or out of the page. For example, the center conductor 215 in coaxial via 125A may transmit the electromagnetic signals into the core 120. Because of the difference in dielectric constants between the materials of the core 120 and the cladding 110, much of the power of the electromagnetic signal is contained within the core 120 as the signal travels down the core 120 to the coaxial via 125B. Once received by the center conductor 215 in coaxial via 125B, the center conductor 215 transmits the signal through the coaxial via 125B to a component or device coupled to the via 125B.

As shown, the outer conductor 210 surrounds the center conductor 215 in each of the coaxial vias 125. In one embodiment, both the outer conductor 210 and the center conductor 215 are cylindrical shape but can be any number of shapes (e.g., elliptical, rectangular, etc.). The outer conductor 210 forms an annular ring through which the center conductor 215 extends.

Figure 3:
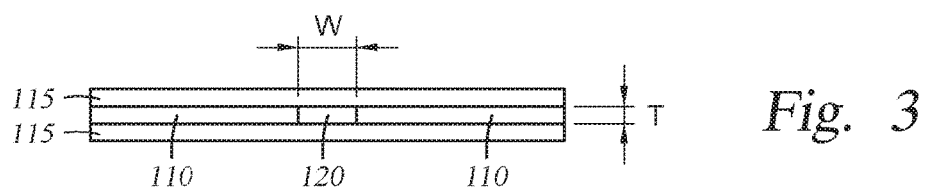
FIG. 3 is a cross section of the dielectric waveguide in FIG. 2, according to one embodiment described herein.

FIG. 3 is a cross section of the dielectric waveguide 200 along the dotted lines 3-3 in FIG. 2, according to one embodiment described herein. As shown, the core 120 and cladding 110 are sandwiched between a pair of ground layers 115. The material of the core 120 directly contacts the material of the cladding 110 such that there is no air gap between the materials. Similarly, the core 120 and cladding 110 directly contact the conductive material of the ground layers 115 (e.g., copper foil).

In one embodiment, the thickness (T) of the core 120 and cladding 110 is between 0.1 mm to 0.8 mm. The width (W) of the core 120 may be between 0.1 mm to 2 mm. The specific width and thickness of the core 120 can vary depending on the frequency or wavelength of the electromagnetic signal transmitted in the dielectric waveguide. For example, the core 120 may have a wider width if used to transmit signals with larger wavelengths. In one embodiment, the core 120 transmits electromagnetic signals that have frequencies less than the frequencies of visible light (e.g., less than 300 GHz). In one embodiment, the core 120 transmits electromagnetic signals with a range between 10 GHz to 200 GHz. In one embodiment, the core 120 transmits electromagnetic signals with a range between 20 GHz to 150 GHz. In one embodiment, the core 120 transmits electromagnetic signals with a range between 30 GHz to 100 GHz.

Although FIGS. 1, 2, and 3 illustrate using the coaxial vias into the dielectric waveguide 200, the simulations below are not limited to introducing electromagnetic signals into the core 120 using coaxial vias. Instead, the designs and functions describe below can be used with any suitable port excitation to introduce the electromagnetic signals into the dielectric waveguides.

Figure 4A:
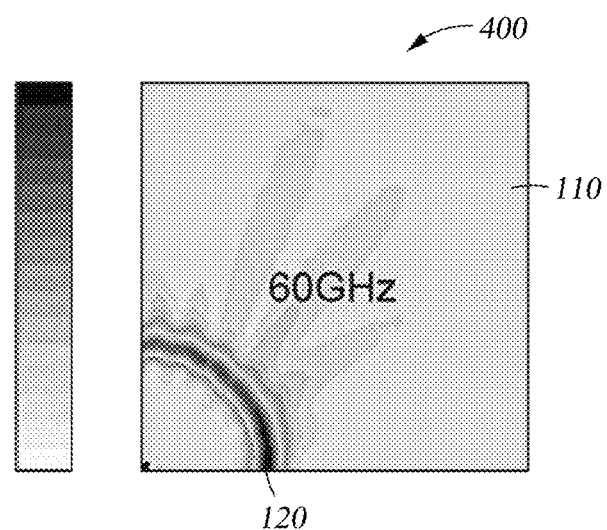
FIGS. 4A-4C illustrate intensities of electromagnetic signals with different frequencies transmitted in a dielectric waveguide, according to embodiments described herein.
Figure 4B:
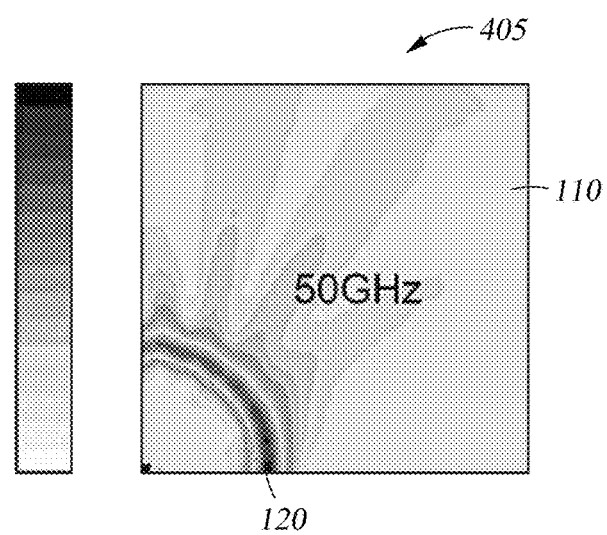
Figure 4C:
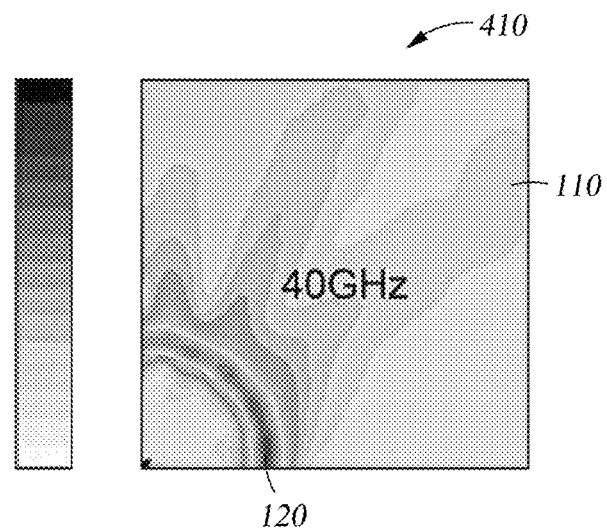

FIGS. 4A-4C illustrate intensities of different frequency electromagnetic signals transmitted in a dielectric waveguide, according to embodiments described herein. Specifically, FIGS. 4A-4C illustrate a curved dielectric waveguide where the core 120 forms in an arc through the cladding 110. As such, electromagnetic signals that are inserted into the bottom of the core 120 travel along the arc until exiting on the left side of the chart 400 as shown in FIG. 4A. Although the difference in dielectric constants between the core 120 and the cladding 110 generate internal reflections which contain the electromagnetic signal primarily in the core 120, some of the electromagnetic signal leaks into the cladding 110 as shown by the charts 400, 405, and 410 as shown in FIGS. 4A, 4B, and 4C, respectively. In simulations illustrated in FIGS. 4A-4C, the dielectric constant of the core 120 is 4.5 at 40 GHZ and the loss is 0.0086 at the same frequency while the assumed cladding is air.

Chart 400 illustrates in FIG. 4A the intensity of an electromagnetic signal in the core 120 and cladding 110 with a frequency of 60 GHz. Generally, the higher the frequency (i.e., the smaller the wavelength) the less leakage experienced by the electromagnetic signal as it traverses the arc formed by the core 120 (which has a length of 12.5 mm). Put differently, the 60 GHz electromagnetic signal illustrated in chart 400 is better contained within the core 120 than the 50

GHz electromagnetic signal illustrated in chart 405 as shown in FIG. 4B and the 40 GHz electromagnetic signal illustrated in chart 410 as shown in FIG. 4C. Thus, a designer can discern from FIGS. 4A-4C that less leakage occurs for higher speed signals than lower speed signals.

The same principles and characteristics described below for an arced arched dielectric waveguide also apply to straight waveguides—i.e., where the core 120 does not bend or change directions when propagating through the dielectric waveguide layer as shown in FIG. 2. That is, even if the core 120 was straight, higher frequency signals experience less leakage into the cladding when traversing the waveguide than lower frequency signals.

Figure 5A:
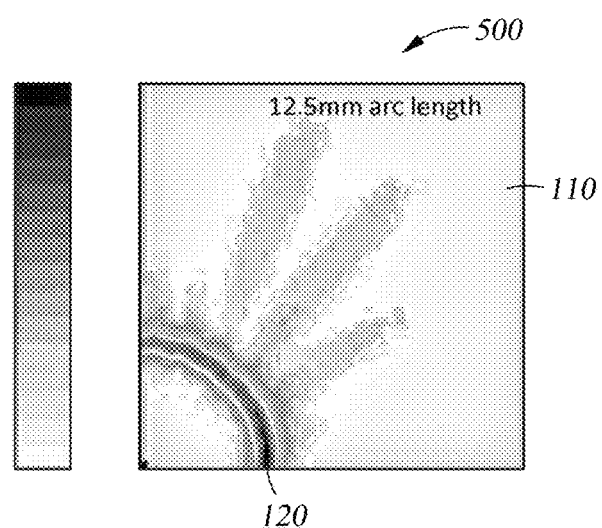
FIGS. 5A-5C illustrate intensities of an electromagnetic signal transmitted in dielectric waveguides with different lengths, according to embodiments described herein.
Figure 5B:
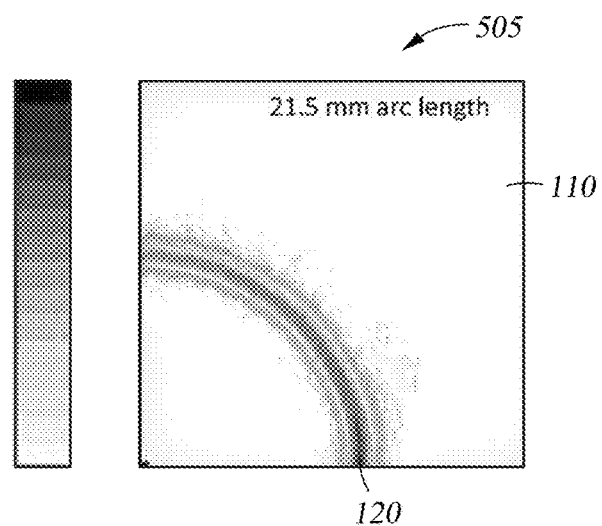
Figure 5C:
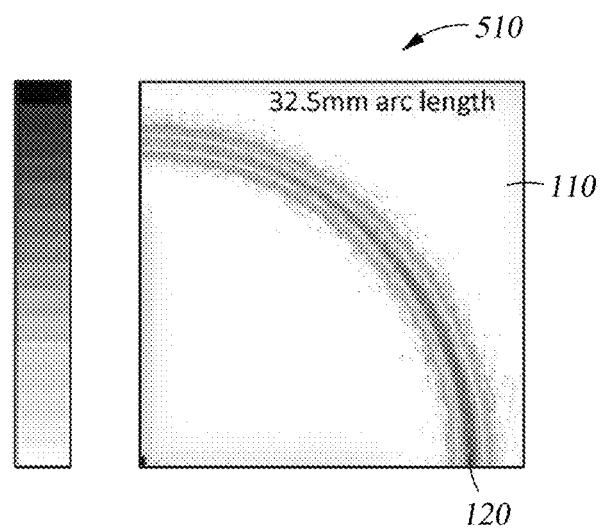

FIGS. 5A-5C illustrate intensities of an electromagnetic signal transmitted in dielectric waveguides with different lengths, according to embodiments described herein. In charts 500, 505, and 510 as shown in FIGS. 5A, 5B, and 5C, respectively, the frequency (and wavelength) of the electromagnetic signal transmitted in the cores 120 is the same—e.g., 60 GHz in this example. However, the radiuses or lengths of the arcs formed by the cores 120 change. Specifically, in FIG. 5A, the length of the core 120 is 12.5 mm with an arc radius of 25/π. In FIG. 5B, the length of the core 120 is 21.5 mm with an arc radius of 43/π. In FIG. 5C, the length of the core 120 is 32.5 mm with an arc radius of 65/π.

As shown, the amount of leakage from the core 120 into the cladding 110 reduces as the length of the cores increases. Put differently, as the radius of the arc made by the core 120 increases, the leakage from the core 120 to the cladding 110 decreases, and vice versa. Thus, sharper turns or twists in the core 120 results in greater leakage into the cladding 110. However, FIGS. 5A-5C also illustrate that if a designer wants to avoid sharp turns, the length of the core 120 must be increased. But increasing the length of the core 120 also increases the loss due to the inherent attenuation resulting from transmitting electromagnetic signals in the dielectric waveguide. That is, longer waveguides have larger inherent losses than shorter waveguides. Thus, increasing the length of the waveguides when designing the waveguide in order to reduce the loss due from a curve or turn in the core 120 should be balanced with the inherent loss of the waveguide which increases as the length of the waveguide increases.

Figure 6:
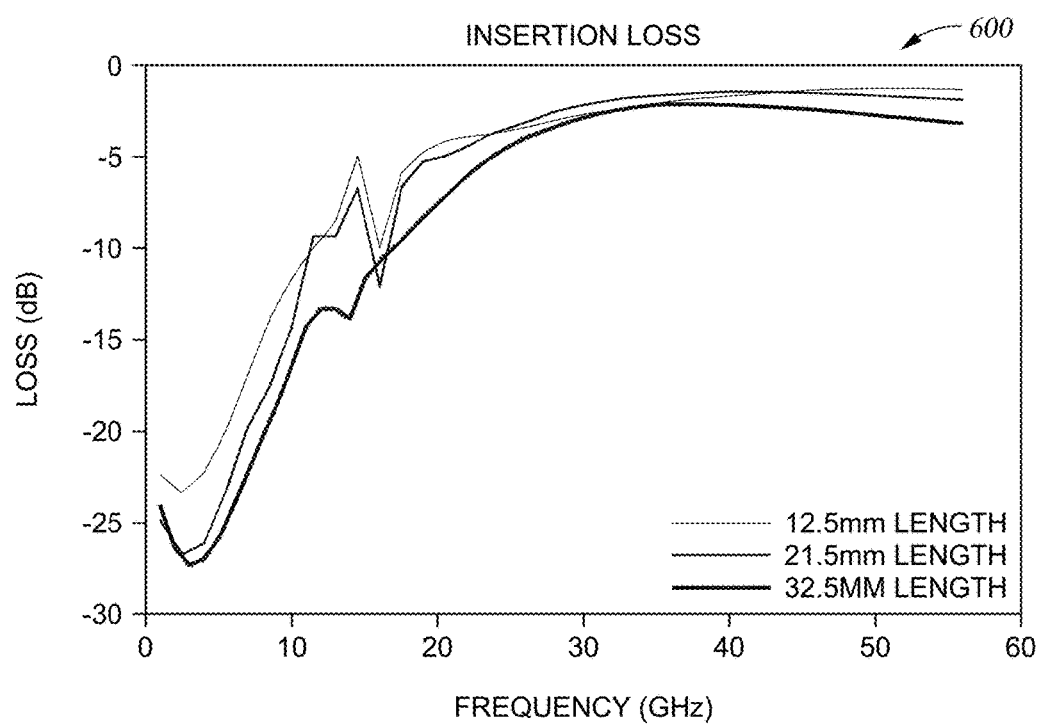
FIG. 6 is a chart illustrating the insertion loss of using dielectric waveguides with different lengths, according to one embodiment described herein.

FIG. 6 is a chart 600 illustrating the insertion loss of using dielectric waveguides with different lengths, according to one embodiment described herein. The X-axis of the chart 600 is frequency measured in gigahertz (GHz) while the Y-axis is loss measured in decibels (dB). The insertion loss is the total loss suffered by the electromagnetic signal when propagating through the dielectric waveguide. The insertion loss includes the inherent loss of the waveguide as well as losses due to the waveguide curving to form arcs.

In chart 600, the thinnest solid line represents the insertion loss of a 12.5 mm length arced waveguide as shown in FIG. 5A, the medium thickness line represents the insertion loss of the 21.5 mm length arced waveguide shown in FIG. 5B, and the thickest line represents the insertion loss of the 32.5 mm length arced waveguide shown in FIG. 5C across a plurality of frequencies. For example, around 33-35 GHz the 12.5 mm length arced waveguide has the poorest performance (worse insertion loss) of the three waveguides. However, as the frequency increases, the performance of the 12.5 mm length waveguide improves while the performance of the 21.5 mm and 32.5 mm length waveguides begin to worsen. This is because at lower frequencies the loss due to the small radius of the 12.5 mm length arced waveguide has a greater effect on the insertion loss. However, at higher frequencies, the loss due to the curvature of the waveguides matters less and instead the insertion loss is determined more by the overall length of the waveguides. Because the 12.5 mm length waveguide is the shortest, its insertion loss improves as the frequencies increase.

A designer can use chart 600 to select the best arc length or curvature for a given system. For example, the frequency range or ranges used by the system may be known—e.g., 60 GHz. By identifying the vertical line that corresponds to 60 GHz along the x-axis, the designer can identify the best curvature to use for the waveguides. In this case, the designer should select the 12.5 mm waveguide since the tighter curvature is less of a factor than the overall length of the waveguide at this frequency. However, if the system transmits data at 30 GHz, than the 21.5 mm arced waveguides has the best performance when curving the waveguides in the PCB.

Figure 7:
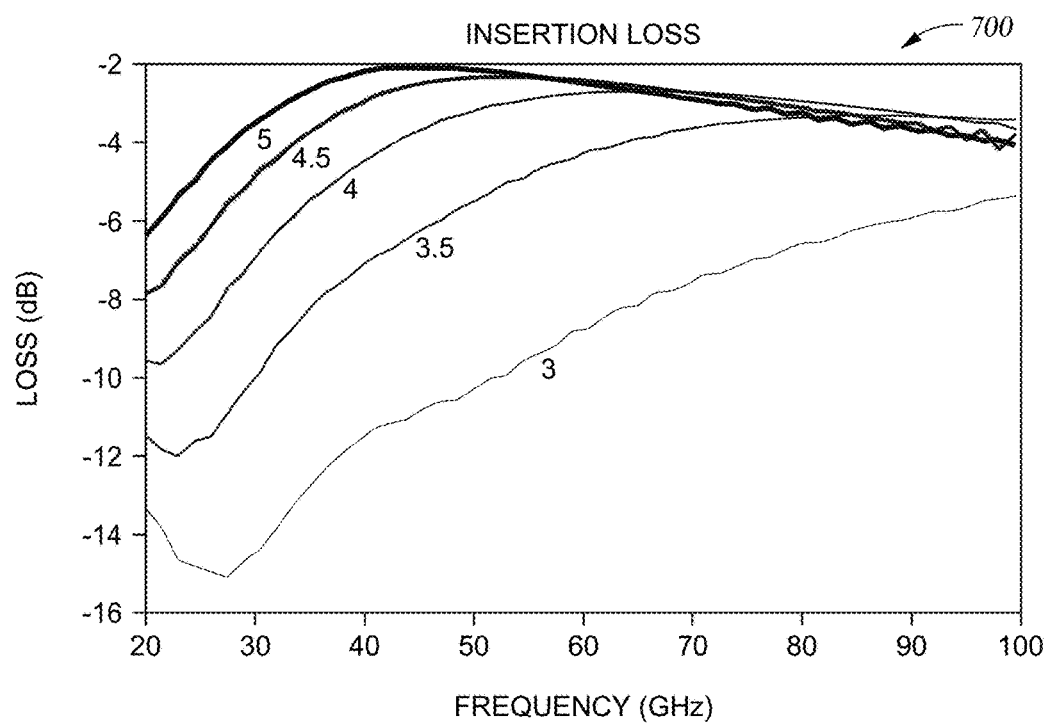
FIG. 7 is a chart illustrating the insertion loss of using cores in a dielectric waveguide with different dielectric constants, according to one embodiment described herein.

FIG. 7 is a chart 700 illustrating the insertion loss of using cores in a dielectric waveguide with different dielectric constants, according to one embodiment described herein. Specifically, the chart 700 illustrates varying the dielectric constant of a 21.5 mm arced core as shown in FIG. 5B. It is assumed that the dielectric constant of the cladding is 2.1 and loss of 0.001 at 10 GHz. Moreover, while the chart 700 illustrates varying the dielectric constant, the dielectric loss of the material is constant—i.e., 0.0086—for the five different plots shown.

For frequencies below 50 GHz, as the dielectric constant is increased, the insertion loss of the 21.5 mm waveguide is decreased—i.e., performance improves. This is because a greater contrast between the dielectric constants of the core and cladding improves internal reflection and mitigates leakage. Thus, improving the contrast between the dielectric constants of the core and cladding can reduce the insertion loss. However, increasing the dielectric constant results in more loss per unit distance. For higher frequencies (i.e., frequencies over 60 GHz), using the higher dielectric constant (e.g., 5) may lead to worse performance than using a lower dielectric constant (e.g., 4.5 or 4). Again, a designer can select the optimal dielectric constant for the core by first selecting the frequency the system use to transmit digital data and then selecting the dielectric constant that results in the lowest insertion loss at that frequency.

Figure 8:
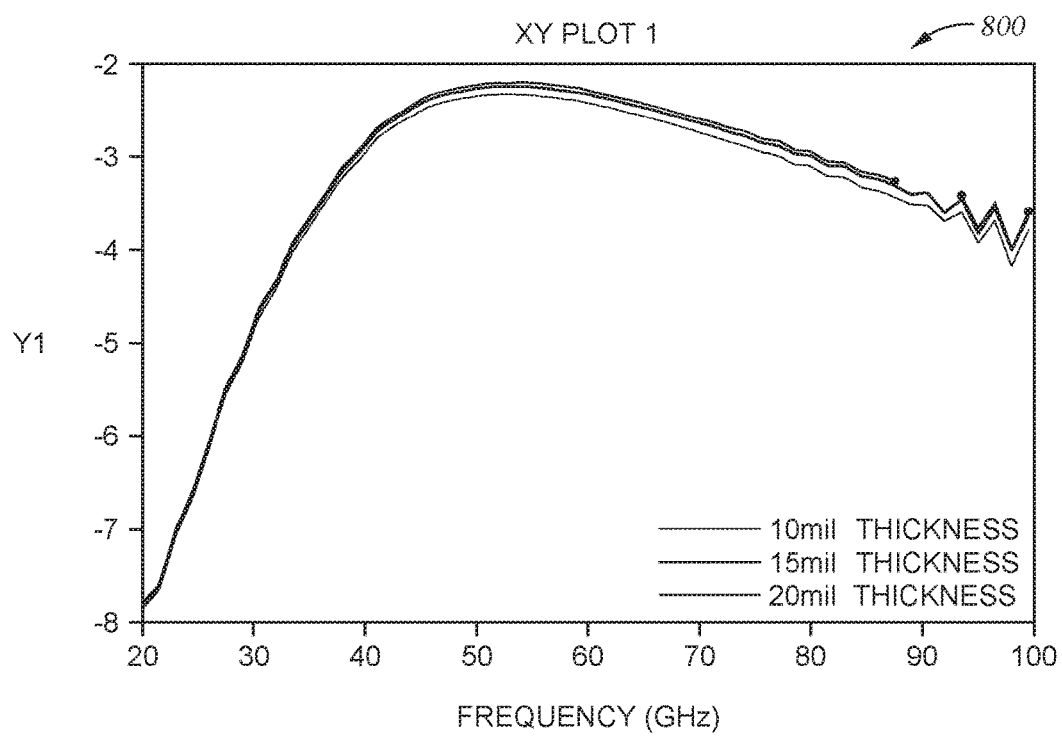
FIG. 8 is a chart illustrating the insertion loss of using different thickness dielectric waveguides, according to one embodiment described herein.

FIG. 8 is a chart 800 illustrating the insertion loss of using different thickness dielectric waveguides, according to one embodiment described herein. Referring to FIG. 3, the thickness (T) is the vertical distance between the ground layers 115 that sandwiches the core 120 and cladding 110 on opposite sides. In chart 800, the three plots (XY PLOTS 1) illustrate the insertion loss (Y1) for a dielectric waveguide that has a 10 mil thickness, a 15 mil thickness, and a 20 mil thickness. As shown, across the frequency range in GHz, the thickness of the dielectric waveguide has a minor effect on the insertion loss. Thus, the thickness can be chosen to suit the particular implementation of the PCB without having a significant impact on performance. As chart 800 illustrates, the performance of the dielectric waveguide does not vary much when the PCB layers are thick or thin. In chart 800, the dielectric constant of the core 120 is 4.5 at 40 GHZ and the loss is 0.0086 at the same frequency while the assumed cladded is air.

Figure 9:
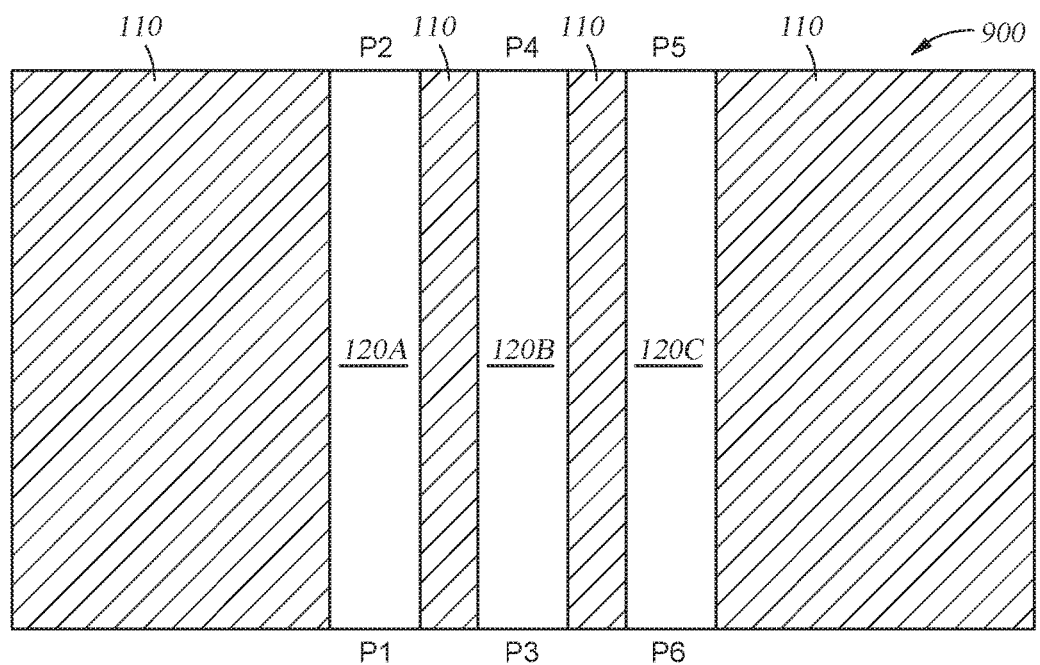
FIG. 9 illustrates a layer in a PCB that includes multiple dielectric waveguides, according to one embodiment described herein.

FIG. 9 illustrates a dielectric waveguide layer 900 in a multi-layer PCB that includes multiple dielectric waveguides, according to one embodiment described herein. As shown, the dielectric waveguide layer 900 includes three cores 120A, 120B, and 120C that are surrounded on two sides by the cladding 110 which form three separate waveguides. That is, the communication system can use the three waveguides to transmit the same or different electromagnetic signals properties. However, due to the close physical proximity of the cores 120A, 120B, and 120C, the three waveguides may experience cross talk where transmitting an electromagnetic signal in one core affects the performance of a neighboring core 120A, 120B, and 120C.

Each of the cores 120A-120C includes two ports or ends. Specifically, the core 120A has ports P1 and P2, the core 120B has ports P3 and P4, and the core 120C has ports P5 and P6. As described above, when electromagnetic signals propagate through the cores 120A-120C, leakage occurs into the cladding due to imperfect internal reflections. This leakage can enter the core of a neighboring waveguide and interfere with signals being transmitted in that waveguide which is referred to herein as cross talk. Although the signals are shown as being straight, in other embodiments, the waveguides may curve, which can affect the amount of cross talk between the cores 120A-120C. In FIG. 9, the dielectric constant of the cores 120A-120C is 4.5 at 40 GHZ and the loss is 0.0086. The cladding 110 has a dielectric constant of 2.1 with a loss of 0.001 at 10 GHz.

Figure 10:
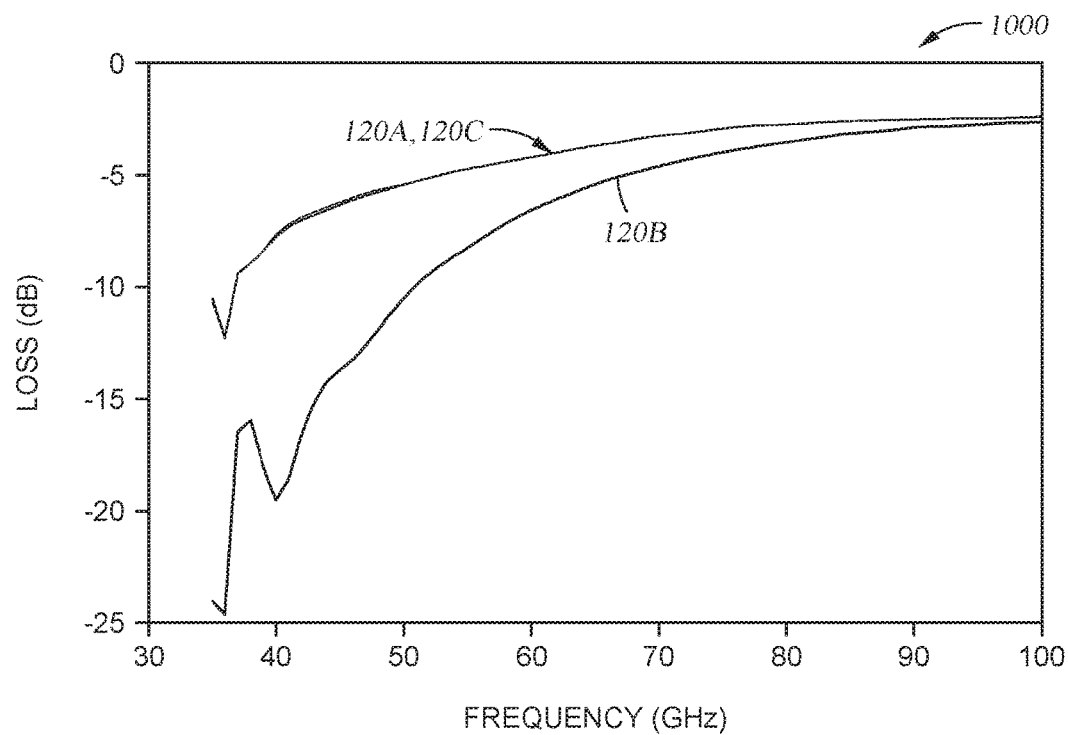
FIG. 10 is a chart illustrating the insertion loss of the waveguides shown in FIG. 9, according to one embodiment described herein.

FIG. 10 is a chart 1000 illustrating the insertion loss in dB of the waveguides shown in FIG. 9, according to one embodiment described herein. As shown, the loss of the waveguides having cores 120A and 120C is the same since these waveguides couple only to the one waveguide formed by core 120B. However, the loss of the waveguide formed by core 120B is greater than cores 120A and 120C due to the fact the core 120B couples to both the waveguides formed by the cores 120A and 120C. That is, the core 120B experiences cross talk resulting from being proximate to two waveguides (i.e., cores 120A and 120C) rather than only one waveguide like the cores 120A and 120C which are affected only by their proximity to core 120B.

Figure 11:
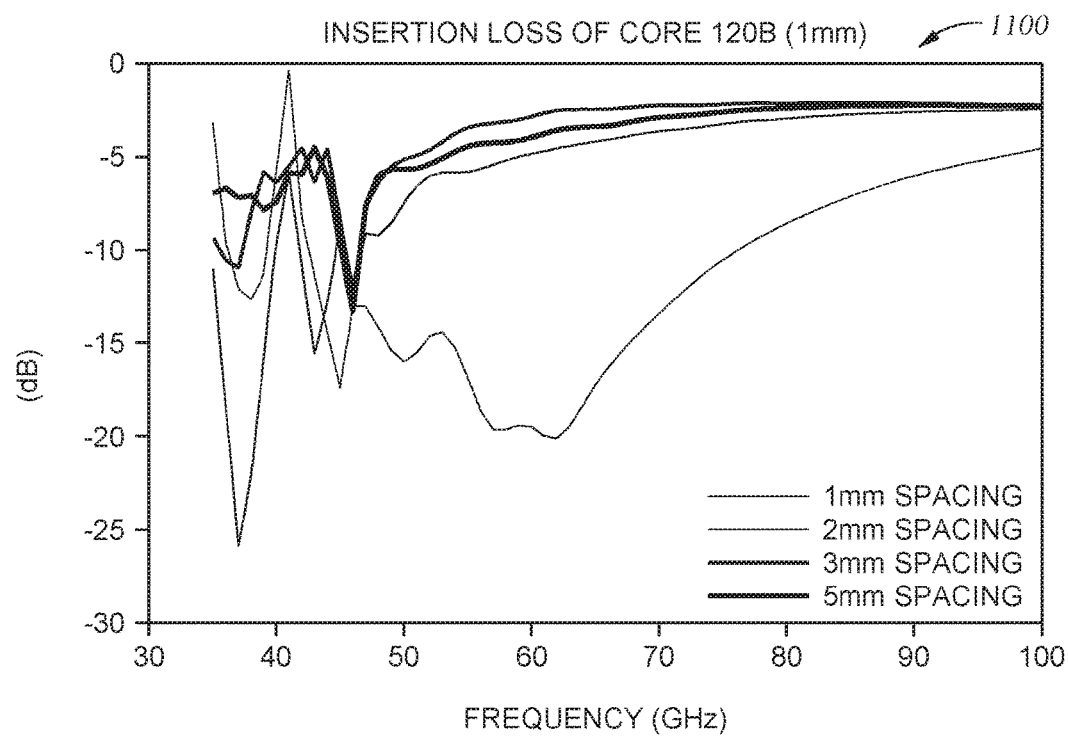
FIG. 11 is a chart illustrating the insertion loss of a waveguide shown in FIG. 9 with a 1 mm core width, according to one embodiment described herein.

FIG. 11 is a chart 1100 illustrating the insertion loss in dB of a waveguide shown in FIG. 9 with a 1 mm core 120B width, according to one embodiment described herein. More specifically, chart 1100 illustrates insertion loss of the center core 120B in FIG. 9 that has a core width of 1 mm. The different thickness plots correspond to different spacing between the center core 120B and the two neighboring cores 120A and 120C. The thinnest plot corresponds to a spacing between the core 120B and the cores 120A, 120C of 1 mm, the second thinnest plot corresponds to a spacing of 2 mm, the second thickest plot corresponds to a spacing of 3 mm and the thickest plot correspond to a spacing of 5 mm.

Generally, the insertion loss for frequencies greater than 45 GHz is much greater for the 1 mm spacing than the other spacing due to the cross talk between the cores 120A-120C. However, as the frequencies get higher, the insertion loss for the other spacings (i.e., 2 mm, 3 mm, and 5 mm) because approximately the same. This is because as the frequencies increase, more of the signal is contained with the core—i.e., does not leak into the cladding—and thus, cross talk has a smaller effect on insertion loss.

Figure 12:
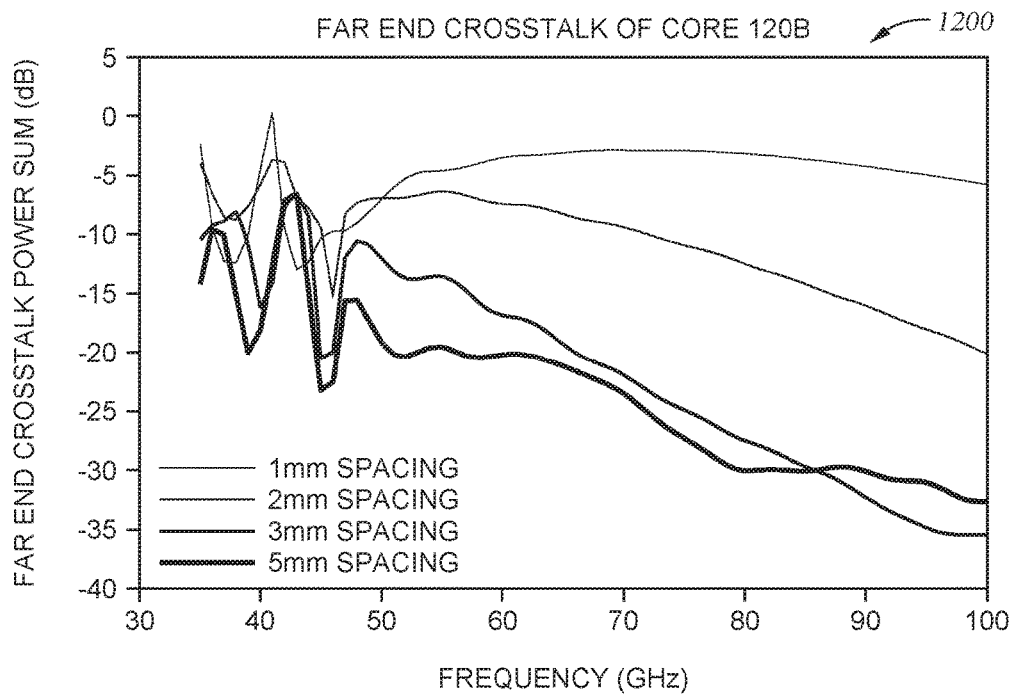
FIG. 12 is a chart illustrating the far end cross talk of a waveguide shown in FIG. 9 with a 1 mm core width, according to one embodiment described herein.

FIG. 12 is a chart 1200 illustrating the far end cross talk of a waveguide shown in FIG. 9 with a 1 mm core 120B width, according to one embodiment described herein. The chart 1200 has an X-axis measured by frequency (GHz) and a Y-axis measured by a far end crosstalk power sum in dB. The far end cross talk for the core 120B is defined as the loss at P4 on the core 120B when a signal is transmitted from P1 on the core 120A at the same time a signal is transmitted from P3 on core 120B. Further, assume that the signals in the cores 120A and 120B propagate in the same direction. Thus, the far end cross talk measures the loss at P4 resulting from propagating a signal from the far end (e.g., P1) on a neighboring waveguide.

Figure 13:
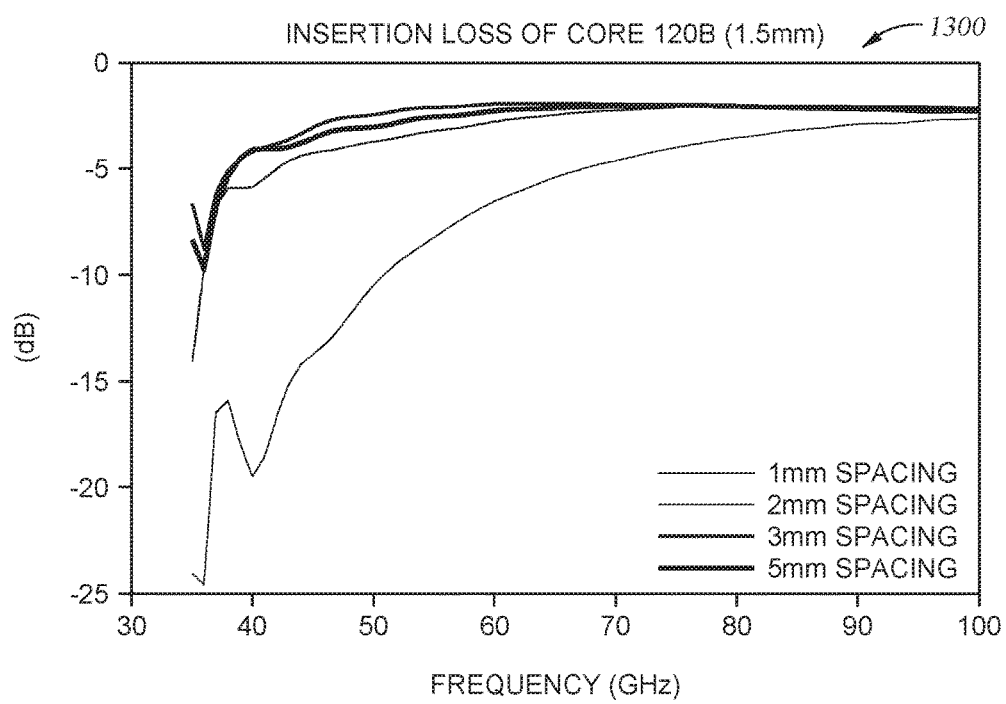
FIG. 13 is a chart illustrating the insertion loss of a waveguide shown in FIG. 9 with a 1.5 mm core width, according to one embodiment described herein.

FIG. 13 is a chart 1300 illustrating the insertion loss in dB of a waveguide shown in FIG. 9 with a 1.5 mm core 120B width, according to one embodiment described herein. That is, chart 1300 is measured using the same parameters as FIG. 11 except the widths of the cores 120 in FIG. 9 are increased from 1 mm to 1.5 mm.

Figure 14:
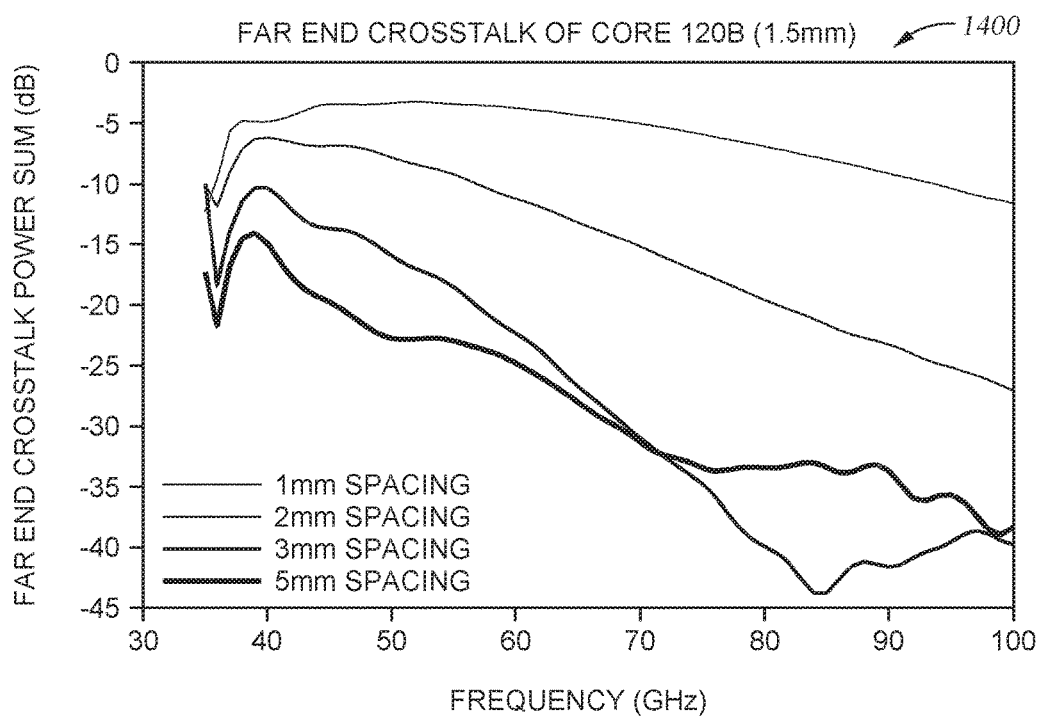
FIG. 14 is a chart illustrating the far end cross talk of a waveguide shown in FIG. 9 with a 1.5 mm core width, according to one embodiment described herein.

FIG. 14 is a chart 1400 illustrating the far end cross talk of a waveguide shown in FIG. 9 with a 1.5 mm core 120B width, according to one embodiment described herein. The chart 1400 is measured using the same parameters as FIG. 12 except the widths of the cores 120 in FIG. 9 are increased from 1 mm to 1.5 mm.

Figure 15:
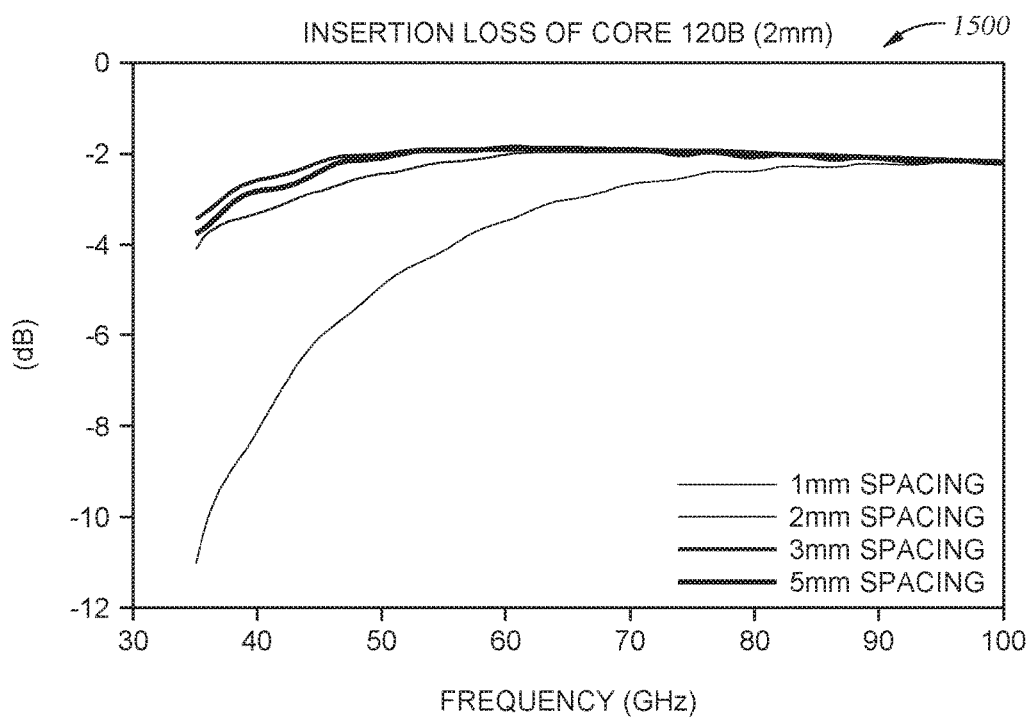
FIG. 15 is a chart illustrating the insertion loss of a waveguide shown in FIG. 9 with a 2 mm core width, according to one embodiment described herein.

FIG. 15 is a chart 1500 illustrating the insertion loss in dB of a waveguide shown in FIG. 9 with a 2 mm core 120B width, according to one embodiment described herein. The chart 1500 is measured using the same parameters as FIG. 11 except the widths of the cores 120A-120C in FIG. 9 are increased from 1 mm to 2 mm.

Figure 16:
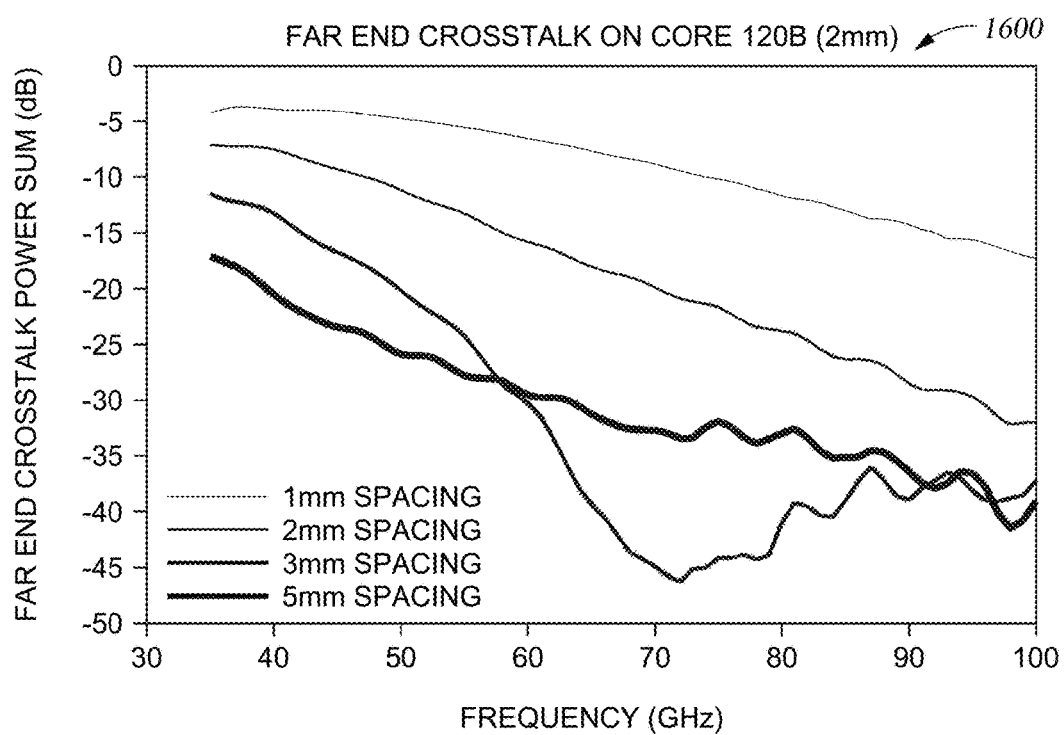
FIG. 16 is a chart illustrating the far end cross talk of a waveguide shown in FIG. 9 with a 2 mm core width, according to one embodiment described herein.

FIG. 16 is a chart 1600 illustrating the far end cross talk of a waveguide shown in FIG. 9 with a 2 mm core 120B width, according to one embodiment described herein. The chart 1600 is measured using the same parameters as FIG. 12 except the widths of the cores 120A-120C in FIG. 9 are increased from 1 mm to 2 mm.

Figure 17A:
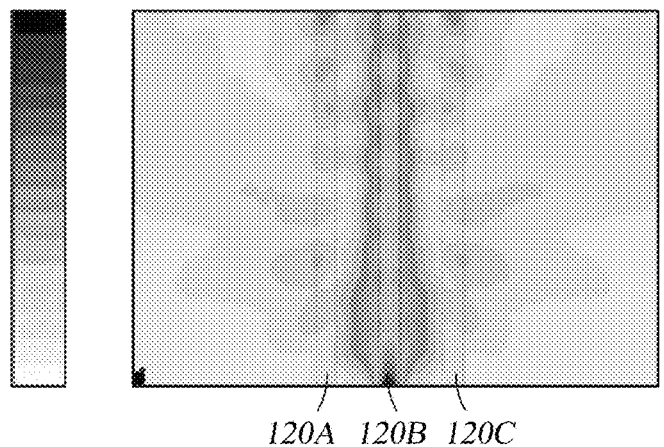
FIGS. 17A-17C illustrate the electric field distribution intensities of the dielectric waveguides in FIG. 9 with different core widths, according to embodiments described herein.
Figure 17B:
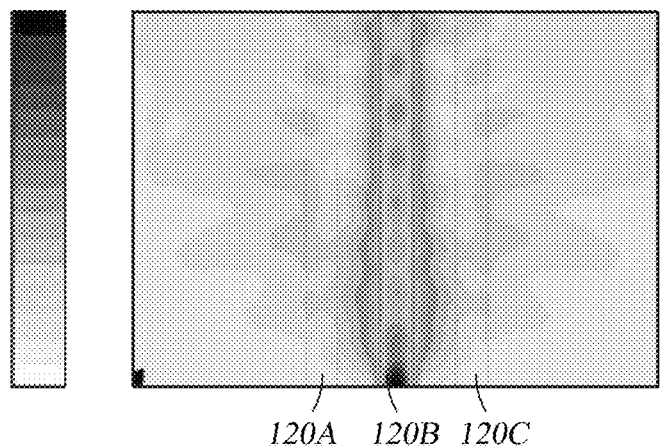
Figure 17C:
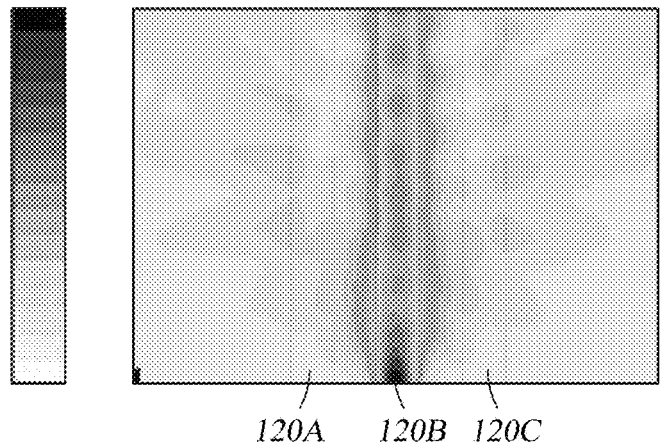

FIGS. 17A-17C illustrate the electric field distribution intensities of the dielectric waveguides in FIG. 9 with different core widths, according to embodiments described herein. In FIG. 17A, the width of each of the cores 120A-120C is 1 mm. In FIG. 17B, the width of each of the cores 120A-120C is 1.5 mm. In FIG. 17C, the width of each of the cores 120A-120C is 2 mm. Moreover, the spacing between the cores 120A-120C is 2 mm. The dark greys in the gradients shown in FIGS. 17A-17C illustrate the portions of the dielectric waveguides that have the greatest intensities of the electromagnetic signal. In FIGS. 17A-17C, a 60 GHz electromagnetic signal is transmitted into the bottom end of the center core 120B. As such, the bottom portion of the center core 120B includes the highest intensity of the electromagnetic signal. However, due to imperfect internal reflections, some of the electromagnetic signal leaks out of the core 120B into the cladding and into the neighboring cores 120A and 120C resulting in cross talk.

When comparing FIGS. 17A-17C, it is clear that using a smaller core width results in greater leakage of the electromagnetic signal into the neighboring cores 120A and 120C which results in cross talk. That is, in FIG. 17A, a greater amount of the intensity of the electromagnetic signal has leaked into the neighboring cores 120A and 120C than in FIGS. 17B and 17C. That is, increasing the widths of the core 120B results in more of the electromagnetic signals being contained in the core 120B. However, increasing the width also decreases that space in the PCB that can be used for routing other dielectric waveguides. That is, there is a tradeoff between increasing the widths of the cores to mitigate cross talk and the waveguide density in a dielectric waveguide layer of the PCB.

Figure 18A:
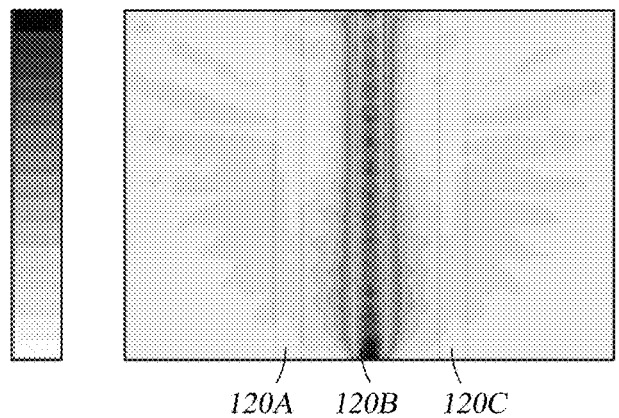
FIGS. 18A-18C illustrate the electric field distribution intensities of the dielectric waveguides in FIG. 9 with different core widths, according to embodiments described herein.
Figure 18B:
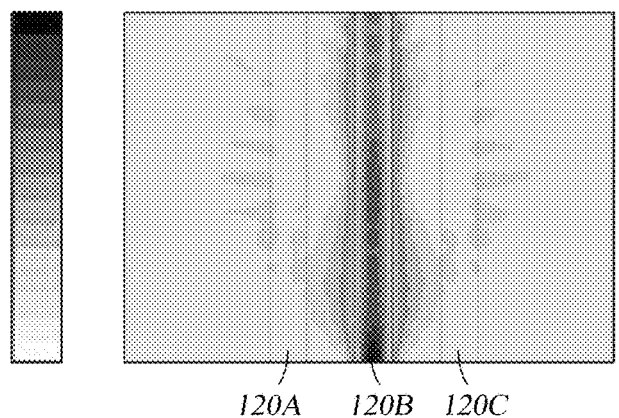
Figure 18C:
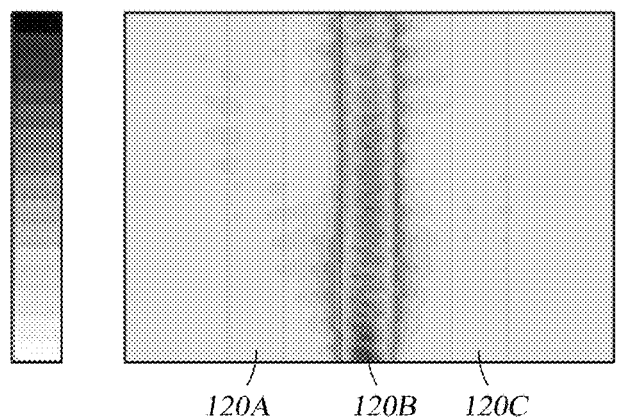
Figure 19A:
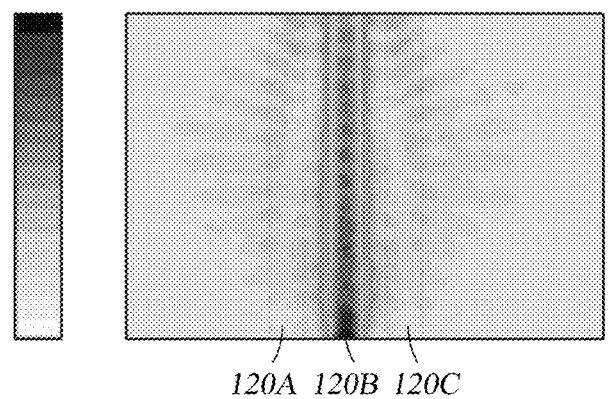
FIGS. 19A-19D illustrate the electric field distribution intensities of the dielectric waveguides in FIG. 9 with different core-to-core spacing, according to embodiments described herein.
Figure 19B:
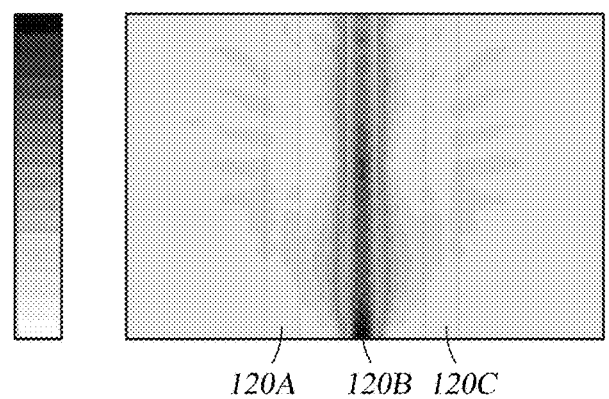
Figure 19C:
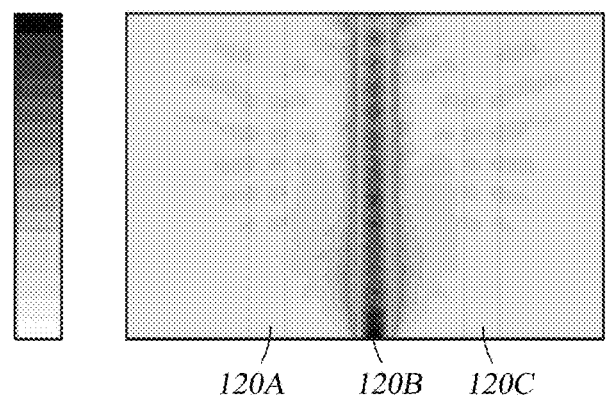
Figure 19D:
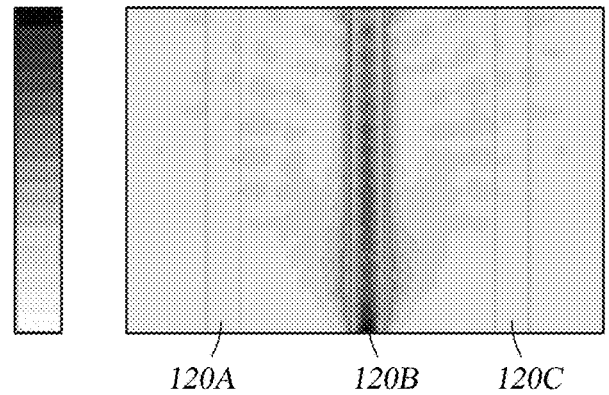
Figure 20A:
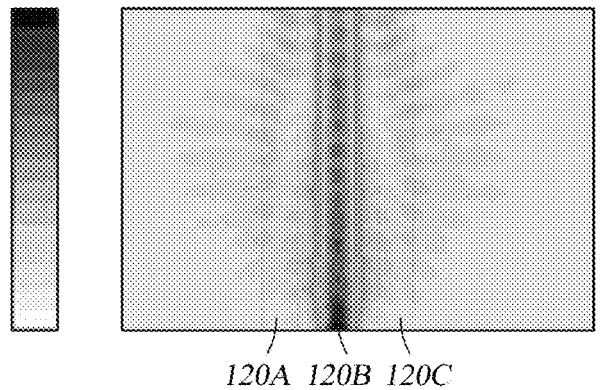
FIGS. 20A-20D illustrate the electric field distribution intensities of the dielectric waveguides in FIG. 9 with different core-to-core spacing, according to embodiments described herein.
Figure 20B:
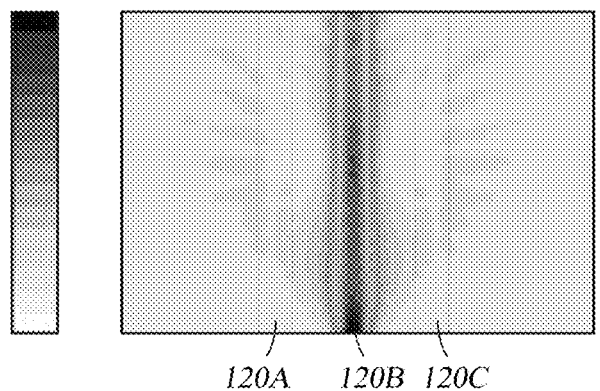
Figure 20C:
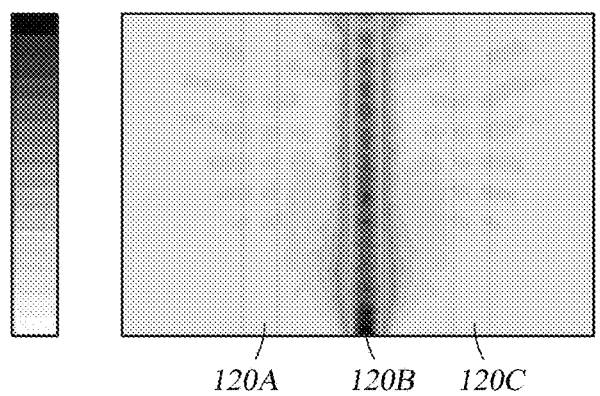
Figure 20D:
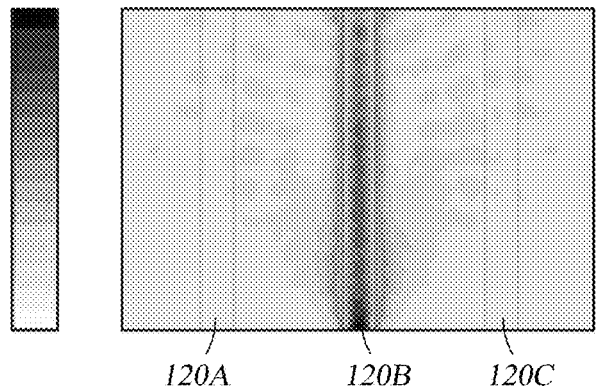

FIGS. 18A-18C illustrate the electric field distribution intensities of the dielectric waveguides in FIG. 9 with different core widths, according to embodiments described herein. In FIG. 18A, the width of each of the cores 120A-120C is 1 mm. In FIG. 18B, the width of each of the cores 120A-120C is 1.5 mm. In FIG. 18C, the width of each of the cores 120A-120C is 2 mm. Moreover, the spacing between the cores 120A-120C is 2 mm. However, instead of transmitting a 60 GHz signal like in FIGS. 17A-17C, in FIGS. 18A-18C a 100 GHz electromagnetic signal is transmitted into the bottom end of the center core 120B.

Comparing FIG. 18A-18C to FIGS. 17A-17C illustrates that less leakage occurs when a higher frequency is transmitted in the core. That is, the cores 120A-120C better contain the higher frequency electromagnetic signal, and thus, less of the signal leaks into the surrounding cladding 110 and the neighboring cores. As a result, the cores 120A-120C in FIGS. 18A-18C experience less cross talk.

FIGS. 19A-19D illustrate the electric field distribution intensities of the dielectric waveguides in FIG. 9 with different core-to-core spacing, according to embodiments described herein. In FIGS. 19A-19D, the widths of the cores 120A-120C remain constant but the spacing between the cores 120A-120C changes. In FIGS. 19A-19D, the spacing between the cores 120A-120C is 1 mm, 2 mm, 3 mm, and 5 mm, respectively. A 60 GHz electromagnetic signal is transmitted into the bottom of the center core 120B. As shown, increasing the spacing between the cores 120A-120C results in less of the intensity of the propagating electromagnetic signal in the core 120B ending up in the neighboring cores 120A and 120C. Thus, FIGS. 19A-19D illustrate that increasing the spacing between cores decreases cross talk.

FIGS. 20A-20D illustrate the electric field distribution intensities of the dielectric waveguides in FIG. 9 with different core-to-core spacing, according to embodiments described herein. The cores 120A-120C in FIGS. 20A-20D have the same arrangement as FIGS. 19A-19D where the widths of the cores 120A-120C are constant (i.e., 2 mm) but the spacing between the cores 120A-120C varies—i.e., 1 mm, 2 mm, 3 mm, and 5 mm, respectively. Moreover, instead of a 60 GHz signal, in FIGS. 20A-20D a 100 GHz signal is transmitted into the bottom end of the center core 120B. Like FIGS. 19A-19D, FIGS. 20A-20D illustrate that increasing the spacing between the cores 120A-120C reduces cross talk. However, with the higher speed signal, the spacing between the cores 120A-120C becomes less important because there is less leakage from the core 120B when transmitting a 100 GHz signal than a 60 GHz signal.

Figure 21:
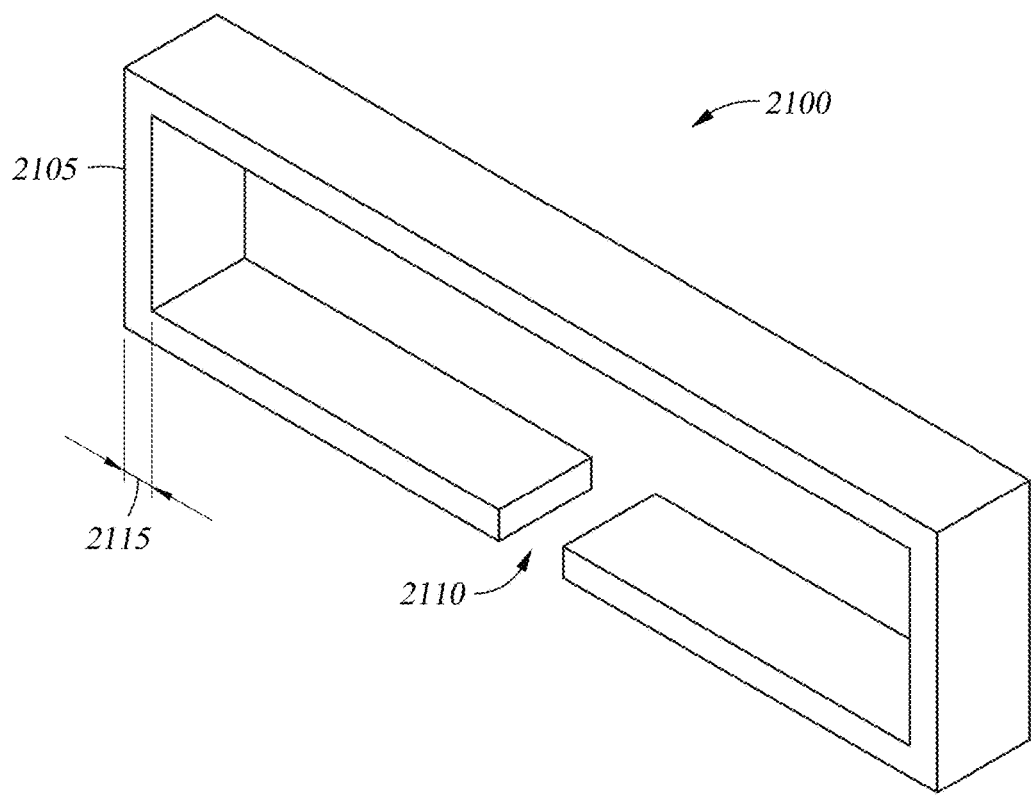
FIG. 21 illustrates a split-ring resonator, according to one embodiment described herein.

FIG. 21 illustrates a split-ring resonator 2100, according to one embodiment described herein. The split-ring resonator 2100 includes a conductor 2105 (e.g., an electrically conductive material) that forms an annular ring. In this embodiment, the conductor 2105 forms a rectangle shape that forms an aperture in the middle. However, instead of forming a complete ring, the conductor 2105 has two ends in a facing relationship that define a gap 2110. Although a rectangle shape is disclosed, in other embodiments, the resonator may have a different shape—e.g., circular, oval, diamond, etc.

The split-ring resonator 2100 is a meta-material where the structure of the resonator 2100 (i.e., the shape of the conductor 2105) causes the split-ring resonator 2100 to have characteristics that are not found in natural materials. Specifically, the frequency response of the split-ring resonator 2100 is different from any natural material in that a certain resonant frequency or frequencies, the split-ring resonator 2100 absorbs more electromagnetic energy than at frequencies above or below the resonant frequency. Thus, the split-ring resonator 2100 can be used to absorb certain frequencies while permitting electromagnetic signals at different frequencies to pass through substantially unaffected.

The dimensions of the split-ring resonator 2100 determine the resonant frequency of the structure. That is, by changing the shape and size of the structure formed by the conductor 2105, a designer can set the resonant frequency of the split-ring resonator 2100. In one embodiment, to resonate at 60 GHz, the split-ring resonator 2100 has a height of 0.2 mm and a length of 2.25 mm. Moreover, the length of the gap 2110 is 0.17 mm and a width 2115 of the conductor 2105 is 0.0508 mm. The thickness of the resonator 2100 is approximately 0.2 mm. However, by altering these dimensions, the resonant frequency of the split-ring resonator 2100 can be changed to any desired frequency between 1 GHz and 300 GHz. Generally, the resonant frequency can be increased by altering the dimensions of height and length of the sides of the conductor 2105 to shrink the area of the aperture. Conversely, the resonant frequency of the split-ring resonator 2100 can be decreased by increasing the size of the aperture.

Because of its frequency response, the split-ring resonator 2100 can be disposed between waveguides to reduce the amount of cross talk between the waveguides. As described in more detail below, the split-ring resonator 2100 is disposed between the waveguides such that the electromagnetic signal leaking from a core of a first waveguide that would otherwise enter the core of a second, neighboring waveguide first passes through the split-ring resonator 2100. If the electromagnetic signal is at or near the resonant frequency, much of the electromagnetic signal is absorbed by the conductor 2105 thereby reducing the amount of electromagnetic signal entering the core of the neighboring waveguide, and thus, reducing cross talk.

Figure 22:
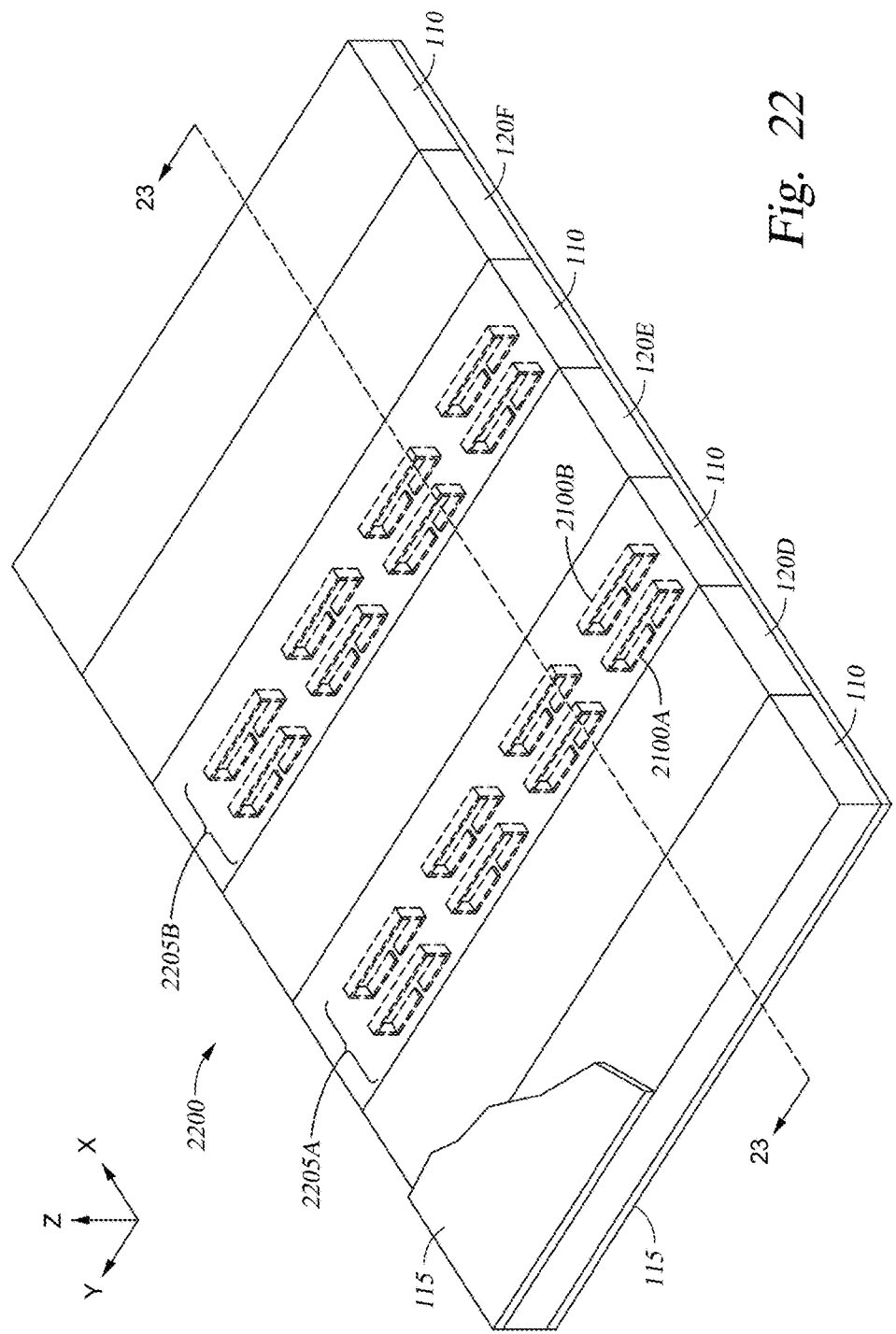
FIG. 22 illustrates a PCB layer that includes periodic resonators disposed between dielectric waveguides, according to one embodiment described herein.

FIG. 22 illustrates a PCB layer 2200 that includes periodic resonators 2205A and 2205B (referred to generally as periodic resonators 2205) disposed between dielectric waveguides, according to one embodiment described herein. For example, the PCB layer 2200 may be the bottom layer of the multi-layer PCB 105 shown in FIG. 1. Although not shown here, coaxial vias may extend down to couple respective ends of the cores 120D, 120E, and 120F (referred to generally as cores 120) in the PCB layer 2200 to upper layers in the multi-layer PCB 105. However, the periodic resonators 2205 are not limited to use with dielectric waveguides in a PCB or with the coaxial vias described above. In other embodiments, the periodic resonators 2205 can be disposed between waveguides in other mediums such as semiconductor layers, dielectric layers for integrated circuits, photonic chips, and the like.

The PCB layer 2200 includes three cores 120D-120F with cladding 110 disposed on each side. Although not shown, in one embodiment, the cores 120 and the cladding 110 are sandwiched between two ground layers. When transmitting electromagnetic signals in the cores 120, some of the signals can leak into the cladding 110 and eventually enter a neighboring core. For example, when transmitting signals with the core 120E, some of the signals are not reflected at the interface between the core 120E and the cladding 110 and leak into the cladding 110. Because the leaked signals travel at least partially in the X direction, these signals can reach one of the neighboring cores—i.e., core 120D or 120F.

The periodic resonators 2205 are embedded in the cladding 110 between the cores 120 to mitigate or prevent the leaked electromagnetic signals from reaching a neighboring core. The PCB layer 2200 includes two periodic resonators: resonator 2205A disposed between cores 120D and 120E, and resonator 2205B disposed between cores 120E and 120F. Each periodic resonator 2205 includes a multiple split-ring resonators (referred to generally as resonators 2100) arranged in an array. For clarity, the cladding 110 is transparent so that the details of the split-ring resonators 2100 disposed in the cladding 110 can be seen. In this embodiment, the periodic resonators 2205 each includes a 2×4 array (two columns and four rows) of the split-ring resonators 2100.

Each split-ring resonator 2100 is arranged in the cladding 110 such that the resonator 2100 extends in the same direction as the cores 120—i.e., the Y direction. As such, the apertures formed by the conductors in the split-ring resonators 2100 lie along planes that are parallel to the Y direction and perpendicular to the X-direction. Thus, electromagnetic signals leaking out of core 120E that travel at least partially in the X-direction are likely to pass through one of the split-ring resonators 2100 in the periodic resonators 2205.

In the embodiment shown, the core 120E is spaced 2 mm from the cores 120D and 120F. With that spacing, the cladding 110 can accommodate two split-ring resonators 2100 side-by-side. As shown, the neighboring split-ring resonators 2100 are aligned along the X-direction. For example, an axis in the X-direction that intersects a point on the split-ring resonator 2100B also intersects the same point on the split-ring resonator 2100A. Thus, an electromagnetic wave traveling only in the X-direction that passes through the aperture of split-ring resonator 2100B also passes through the aperture of split-ring resonator 2100A. Although FIG. 22 illustrates aligning the neighboring split-ring resonators in the X-direction in the periodic resonators 2205, in another embodiment, the neighboring split-ring resonators may be misaligned—i.e., staggered. Furthermore, in FIG. 22 each periodic resonator 2205 has two columns of split-ring resonators 2100 but it may be desired to have as many columns of split-ring resonators 2100 as permitted by the spacing between the cores 120 and the fabrication techniques. For example, if the spacing between the cores 120 was 3 mm, the periodic resonators 2205 may have three rows of split-ring resonators 2100 rather than only two as shown which can further reduce the crosstalk between the waveguides. In one embodiment, the spacing between the cores 120 is less than 10 mm or less than 5 mm. For spacings that are greater than 5-10 mm, the effects of crosstalk are minimal, and thus, adding the periodic resonators 2205 may not justify the additional fabrication costs.

In one embodiment, the split-ring resonators 2100 are spaced apart in the Y-direction as close as permitted by the fabrication techniques used to form the PCB layer 2200. Minimizing the gap between the split-ring resonators 2100 in a column may improve the effectiveness of the periodic resonators 2205 when reducing cross talk. That is, by arranging the split-ring resonators 2100 as close as possible in the columns, the portion of the electromagnetic signal passing through the resonators 2100 is increased. As described above, if the electromagnetic signals are at or near the resonant frequencies, the split-ring resonators 2100 can absorb some of these signals thereby minimizing the amount of electromagnetic signals transmitted by one core from leaking into a neighboring core.

In one embodiment, the split-ring resonators 2100 are spaced apart in the X-direction by a factor of the wavelength of the resonant frequency divided by eight. In this embodiment, the 2 mm spacing between the cores permits each periodic resonator 2205 to have two columns of split-ring resonators 2100 and still maintain the spacing. However, as mentioned above, if the spacing between the cores is increased to 3 mm, the periodic resonators 2205 may have sufficient space to have three columns of split-ring resonators 2100 and still maintain the one-eighth wavelength spacing at the desired resonant frequency. Further, although the gaps in the split-ring resonators 2100 are shown as being on the bottom, in other embodiments, the split-ring resonators 2100 could be inverted such that the gap is at the top of the PCB layer 2200 and still mitigate the cross talk between the cores 120.

Figure 23:
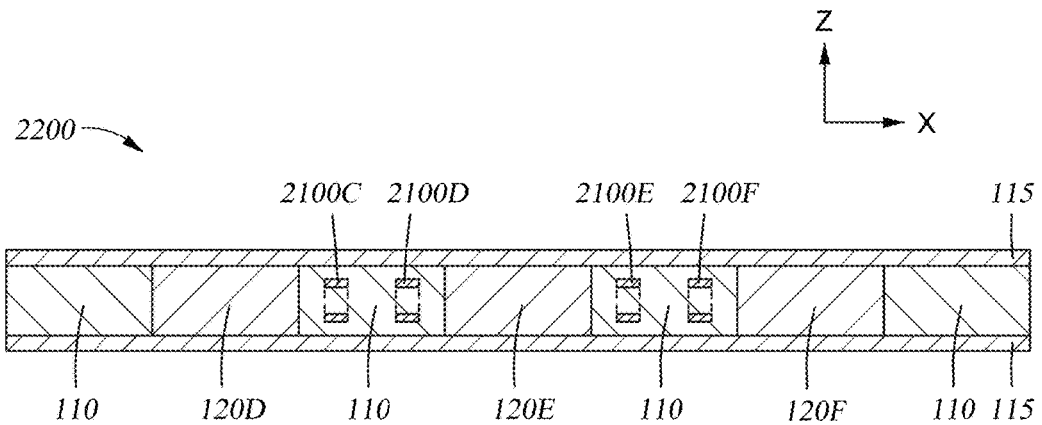
FIG. 23 illustrates a cross section of the PCB layer in FIG. 22, according to one embodiment described herein.

FIG. 23 illustrates a cross section of the PCB layer in FIG. 22 along the dotted lines 23-23, according to one embodiment described herein. As shown, the cross section illustrates a side view of the cladding 110, the cores 120D-120F, and four of the split-ring resonators 2100C, 2100D, 2100E, and 2100F. The cross section also illustrates ground layers 115 disposed above and below the cores 120 and the cladding 110. In this embodiment, both the cores 120 and cladding directly contact the ground layers 115.

In FIG. 23, only a top portion and a bottom portion of the conductors forming the split-ring resonators 2100 are shown. That is, the cross section illustrates a portion in the split-ring resonators 21002100C, 2100D, 2100E, and 2100F where the conductor forms a top boundary and bottom boundary of the aperture. If the cross section were taken at the gap 2110 shown in FIG. 21, then only the top portion of the conductor would be shown. As shown in FIG. 23, the split-ring resonators 21002100C, 2100D, 2100E, and 2100F in neighboring columns are aligned in the Z-direction. For example, the top and bottom portions of the split-ring resonator 2100C are on the same Z-plane as the top and bottom portions of the split-ring resonator 2100D. Similarly, the top and bottom portions of the split-ring resonator 2100E are on the same Z-planes as the top and bottom portions of the split-ring resonator 2100F.

Figure 24:
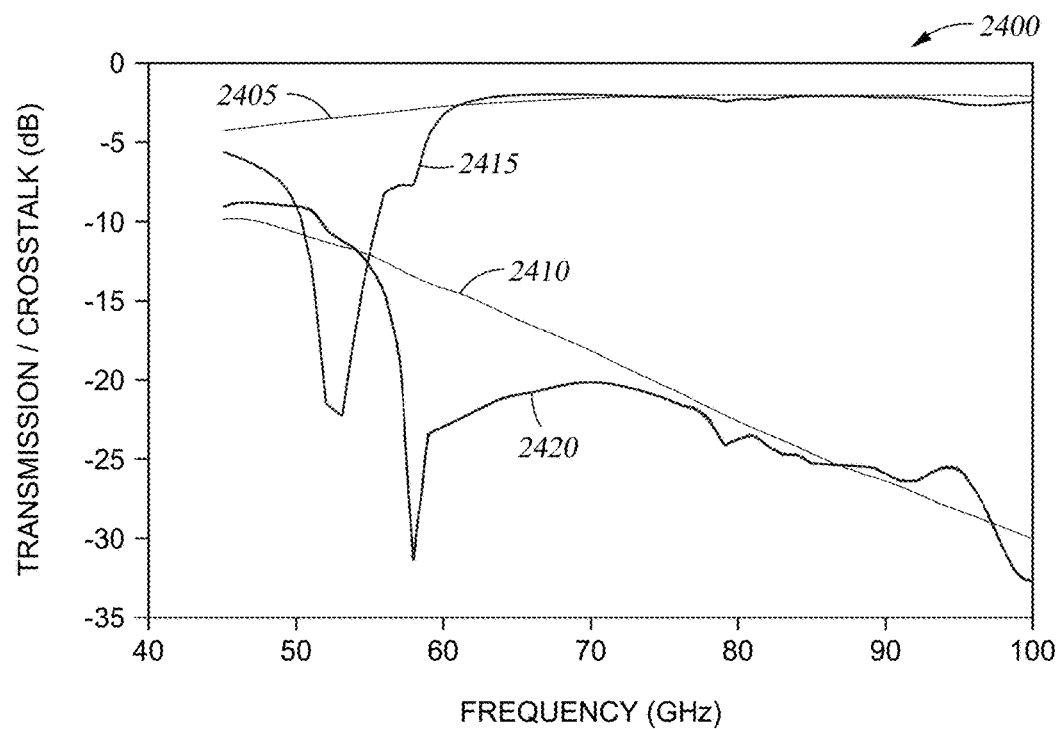
FIG. 24 is a graph 2400 illustrating mitigating cross talk between dielectric waveguides using the periodic resonator, according to one embodiment described herein.

FIG. 24 is a graph 2400 illustrating mitigating cross talk between dielectric waveguides using the periodic resonator, according to one embodiment described herein. The graph 240 includes an X-axis illustrating frequency (GHz) and a Y-axis illustrating transmission/crosstalk (dB). The graph 2400 includes four plots that illustrate the insertion loss and the far end cross talk of the center core 120E in FIG. 22 with and without the periodic resonators 2205. Specifically, plot 2405 illustrates the insertion loss of the core 120E without the periodic resonators 2205 and plot 2410 illustrates the far end cross talk of the core 120E without the periodic resonators 2205. In contrast, plot 2415 illustrates the insertion loss and plot 2420 illustrates the far end cross talk of the core 120E with the periodic resonators 2205. In this embodiment, the resonance frequency of the split-ring resonators is 60 GHz.

As illustrated by plot 2420, at the resonance frequency (60 GHz) the crosstalk is reduced dramatically relative to plot 2405. This reduction in crosstalk between 60 GHz to about 85 GHz does not cause degraded transmission. That is, the insertion loss for the core 120E for frequencies at and above 60 GHz remains approximately the same as when the split-ring resonators 2100 are not present between the cores. However, the addition of the split-ring resonators 2100 does reduce the amount of signal transmitted through the core 120E at frequencies below 60 GHz as shown by the dip in plot 2415 between 45 GHz and 60 GHz. Put differently, the resonators 2100 significantly reduces signals below 60 GHz as the propagate through the core 120E (i.e., the loss due to transmission is increased). This is caused by the split-ring resonators 2100 absorbing some of the power from the center core 120E and the wave propagation itself being blocked in part by the resonating structure.

As long as the resonator 2100 is designed for the appropriate frequency band, the far end crosstalk from other waveguides can be greatly reduced while not increasing insertion loss. Put differently, if a communication system is designed to transmit frequencies primarily in the range of 60-80 GHz in the cores 120, then chart 2400 illustrates that adding the split-ring resonators 2100 with a resonant frequency of 60 GHz reduces crosstalk but does not have a signification negative impact on insertion loss. The plot 2415 illustrates that signals below 60 GHz are attenuated strongly by the split-ring resonators 2100 while signals transmitted at speeds above 60 GHz are not strongly affected by the resonators 2100—i.e., the transmission loss for signals about 60 GHz is essentially the same when the resonators 2100 are not present. However, because the communication system does not transmit electromagnetic signals at frequencies below 60 GHz, the negative impact of the split-ring resonators at frequencies below 60 GHz does not affect the performance of the system. Of course, if the communication system transmitted signals at or above 50 GHz, then the design of the split-ring resonator can be adjusted (e.g., the size of the aperture can be increased) to resonate at 50 GHz instead of 60 GHz. Thus, the split-ring resonator can mitigate cross talk for frequencies at or above 50 GHz without having a negative impact on insertion loss for frequencies in that range.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A dielectric waveguide layer, comprising:
   a first dielectric core forming a first dielectric waveguide;
   a second dielectric core forming a second dielectric waveguide;
   a cladding disposed between the first and second dielectric cores, wherein a material of the first core has a higher dielectric constant than a material of the cladding; and
   a periodic resonator disposed in the cladding between the first and second dielectric cores, the periodic resonator comprising a plurality of resonating structures arranged in an array, wherein each of the plurality of resonating structures is configured to resonate at a common resonant frequency, wherein the plurality of resonating structures are split ring resonators.

2. The dielectric waveguide layer of claim 1, further comprising:
   a first ground layer comprising a first conductive material; and
   a second ground layer comprising a second conductive material, wherein the first dielectric core, the second dielectric core, and the cladding are disposed between the first and second ground layers, and wherein the first dielectric core, the second dielectric core, and the cladding directly contact both the first and second ground layers.

3. The dielectric waveguide layer of claim 1, wherein the split ring resonators each includes a respective annular conductor, wherein respective apertures formed by the respective annular conductors lie on a plane that is parallel with an axis on which the first dielectric core extends through the dielectric waveguide layer.

4. The dielectric waveguide layer of claim 1, wherein the array has at least two columns and two rows of the plurality of resonating structures.

5. The dielectric waveguide layer of claim 4, wherein the split ring resonators in neighboring columns in the array are aligned along a first axis that is perpendicular to a second axis on which the first dielectric core extends through the dielectric waveguide layer.

6. The dielectric waveguide layer of claim 1, wherein a distance between the first and second cores is less than 5 mm.

7. The dielectric waveguide layer of claim 1, wherein the common resonant frequency is between 10-300 GHz.

8. A multi-layer printed circuit board (PCB), comprising:
   a first dielectric core forming a first dielectric waveguide;
   a second dielectric core forming a second dielectric waveguide;
   a cladding disposed between the first and second dielectric cores, wherein a material of the first core has a higher dielectric constant than a material of the cladding;
   a periodic resonator disposed in the cladding between the first and second dielectric cores, the periodic resonator comprising a plurality of resonating structures arranged in an array, wherein each of the plurality of resonating structures is configured to resonate at a common resonant frequency, wherein the array has at least two columns and two rows of the plurality of resonating structures.

9. The multi-layer PCB of claim 8, further comprising:
   a first ground layer comprising a first conductive material; and
   a second ground layer comprising a second conductive material, wherein the first dielectric core, the second dielectric core, and the cladding are disposed between the first and second ground layers, and wherein the first dielectric core, the second dielectric core, and the cladding directly contact both the first and second ground layers.

10. The multi-layer PCB of claim 8, wherein the plurality of resonating structures are split ring resonators.

11. The multi-layer PCB of claim 8, wherein the plurality of resonating structures each includes a respective annular conductor, wherein respective apertures formed by the respective annular conductors lie on a plane that is parallel with an axis on which the first dielectric core extends through the multi-layer PCB.

12. The multi-layer PCB of claim 8, wherein the common resonant frequency is between 10-300 GHz.

13. The multi-layer PCB of claim 8, wherein resonating structures of the plurality of resonating structure in neighboring columns in the array are aligned along a first axis that is perpendicular to a second axis on which the first dielectric core extends through the multi-layer PCB.

14. The multi-layer PCB of claim 8, wherein a distance between the first and second cores is less than 5 mm.

15. A method, comprising:
transmitting a non-optical electromagnetic signal into a first end of first dielectric core forming a first dielectric waveguide in a dielectric waveguide layer, wherein the dielectric waveguide layer includes a second dielectric core forming a second dielectric waveguide, wherein a cladding is disposed between the first and second dielectric cores, wherein a material of the first core has a higher dielectric constant than a material of the cladding; and
receiving the non-optical electromagnetic signal at a second end of the first dielectric core, wherein a periodic resonator is disposed in the cladding between the first and second dielectric cores, the periodic resonator comprising a plurality of resonating structures arranged in an array, wherein each of the plurality of resonating structures is configured to resonate at a frequency of the non-optical electromagnetic signal to mitigate cross talk between the first dielectric core and the second dielectric core, wherein the plurality of resonating structures each includes a respective annular conductor, wherein respective apertures formed by the respective annular conductors lie on a plane that is parallel with an axis on which the first dielectric core extends through the dielectric waveguide layer.

16. The method of claim 15, wherein the plurality of resonating structures are split ring resonators.

17. The method of claim 15, wherein the dielectric waveguide layer further comprise:
a first ground layer comprising a first conductive material; and
a second ground layer comprising a second conductive material, wherein the first dielectric core, the second dielectric core, and the cladding are disposed between the first and second group layers, and wherein the first dielectric core, the second dielectric core, and the cladding directly contact both the first and second ground layers.

* * * * *